United States Patent
Takahashi

(10) Patent No.: US 7,851,804 B2
(45) Date of Patent: Dec. 14, 2010

(54) DISPLAY DEVICE

(75) Inventor: Kei Takahashi, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 4 days.

(21) Appl. No.: 12/054,949

(22) Filed: Mar. 25, 2008

(65) Prior Publication Data

US 2008/0308792 A1 Dec. 18, 2008

(30) Foreign Application Priority Data

May 17, 2007 (JP) ............... 2007-132181

(51) Int. Cl.
*H01L 27/14* (2006.01)

(52) U.S. Cl. .......................... 257/72; 257/59

(58) Field of Classification Search ............. 257/40, 257/59, 72; 313/505
See application file for complete search history.

(56) References Cited

U.S. PATENT DOCUMENTS

| | | | |
|---|---|---|---|
| 5,637,187 A * | 6/1997 | Takasu et al. ............ 438/30 |
| 6,372,609 B1 | 4/2002 | Aga et al. | |
| 6,380,046 B1 | 4/2002 | Yamazaki | |
| 7,119,365 B2 | 10/2006 | Takafuji et al. | |
| 7,199,024 B2 | 4/2007 | Yamazaki | |
| 7,508,034 B2 * | 3/2009 | Takafuji et al. ............ 257/347 |
| 2002/0005819 A1 * | 1/2002 | Ronzani et al. ............ 345/8 |
| 2003/0116768 A1 | 6/2003 | Ishikawa | |
| 2004/0066136 A1 | 4/2004 | Yoneda et al. | |
| 2004/0232952 A1 | 11/2004 | Kimura et al. | |
| 2005/0145861 A1 * | 7/2005 | Kawakami et al. ............ 257/88 |
| 2005/0179372 A1 | 8/2005 | Kawakami et al. | |
| 2005/0242713 A1 | 11/2005 | Yamazaki | |
| 2005/0255617 A1 | 11/2005 | Yamazaki et al. | |
| 2005/0258443 A1 * | 11/2005 | Yamazaki et al. ............ 257/93 |
| 2006/0118871 A1 * | 6/2006 | Kato ............ 257/347 |
| 2006/0202206 A1 * | 9/2006 | Koyama et al. ............ 257/67 |

FOREIGN PATENT DOCUMENTS

JP 2002-124467 4/2002
WO WO2005/050269 A1 6/2005

* cited by examiner

*Primary Examiner*—Douglas M Menz
(74) *Attorney, Agent, or Firm*—Nixon Peabody LLP; Jeffrey L. Costellia

(57) ABSTRACT

A single-crystal semiconductor layer which is separated from a single-crystal semiconductor substrate, and bonded to and provided over a supporting substrate is used, whereby a transistor having uniform characteristics can be formed. A reference circuit having a bipolar transistor is provided, whereby temperature dependence of a driving transistor which is driven by supplying current to the light-emitting element of a pixel is compensated.

10 Claims, 18 Drawing Sheets

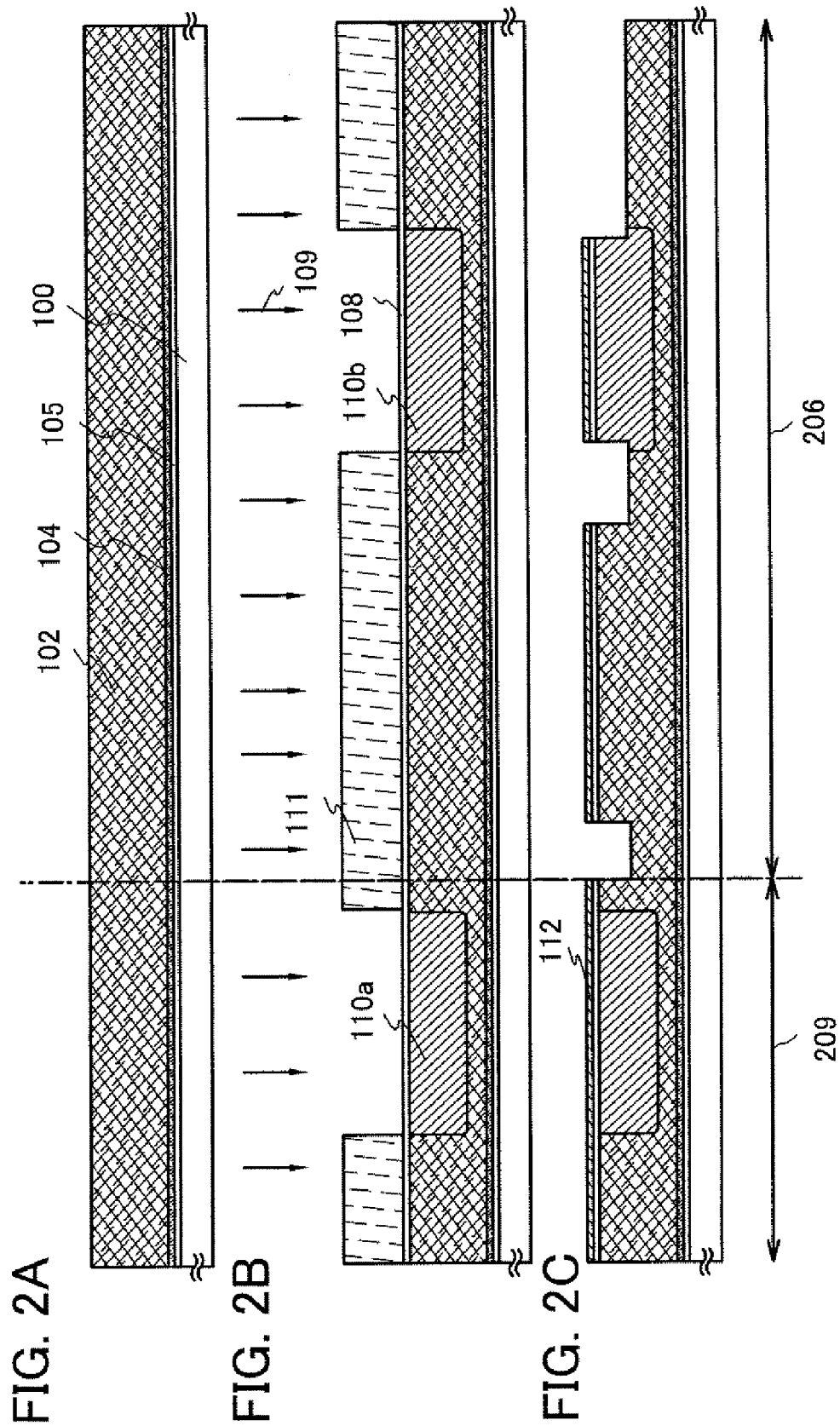

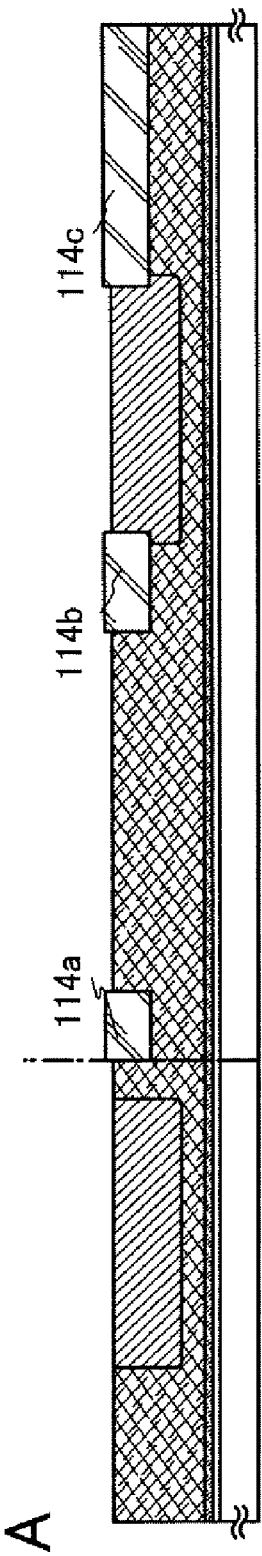
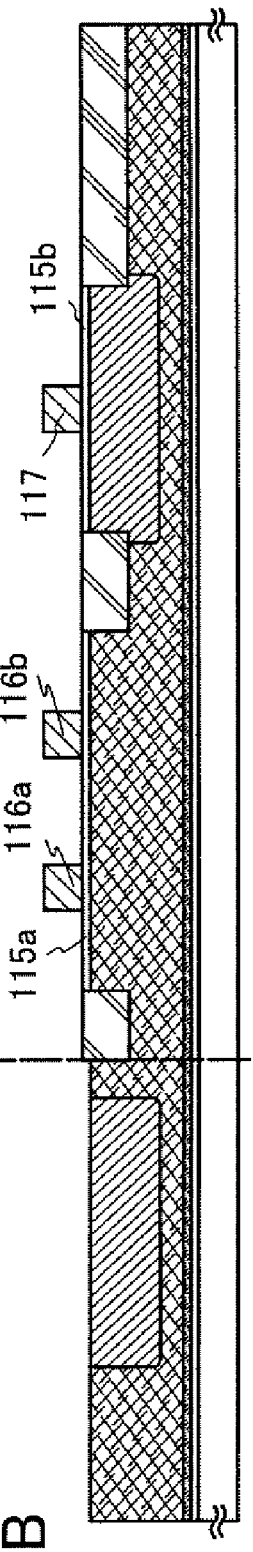
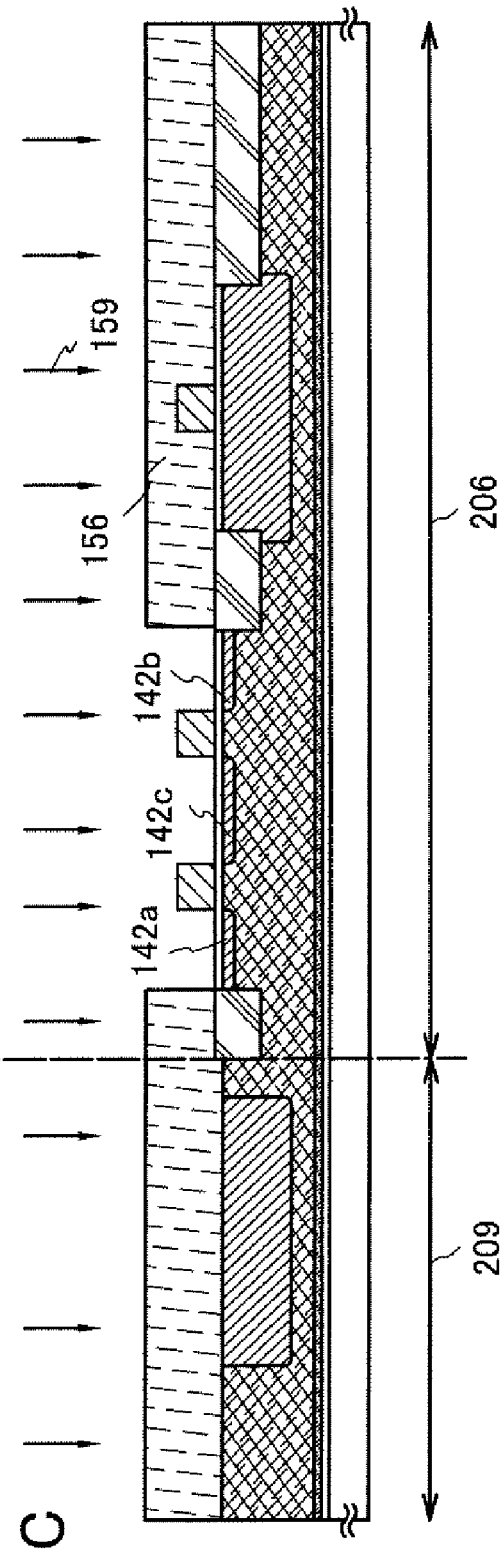
FIG. 3A
FIG. 3B
FIG. 3C

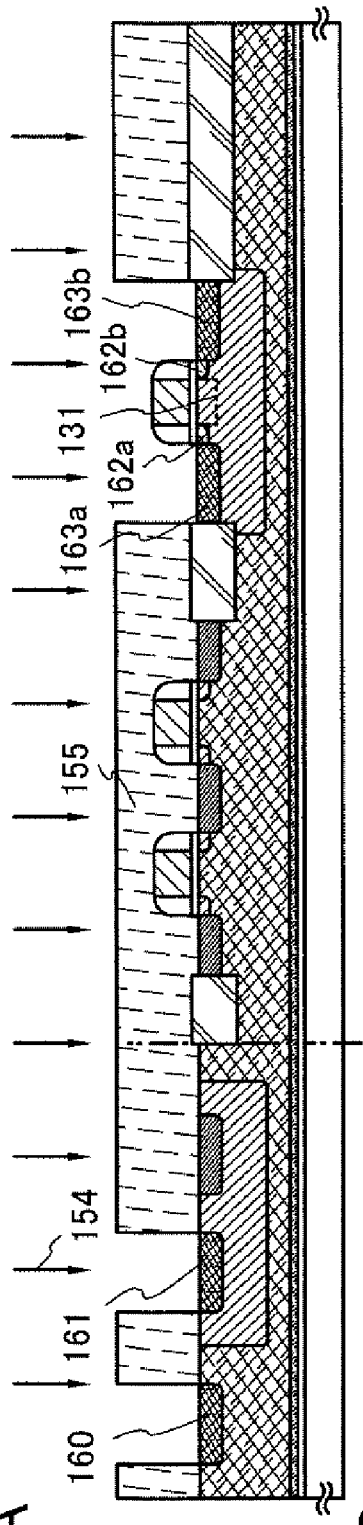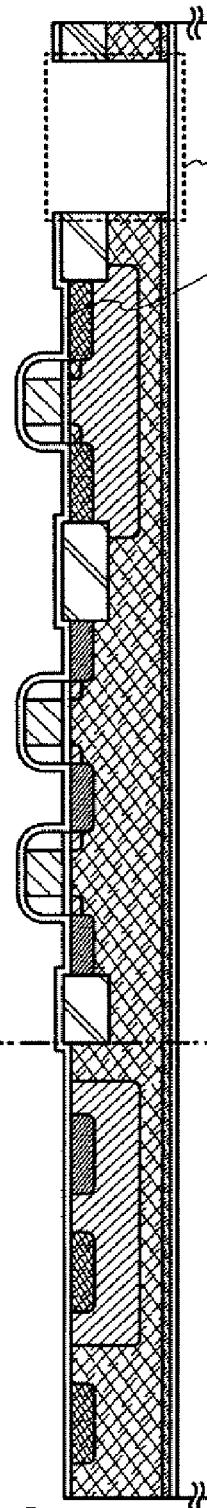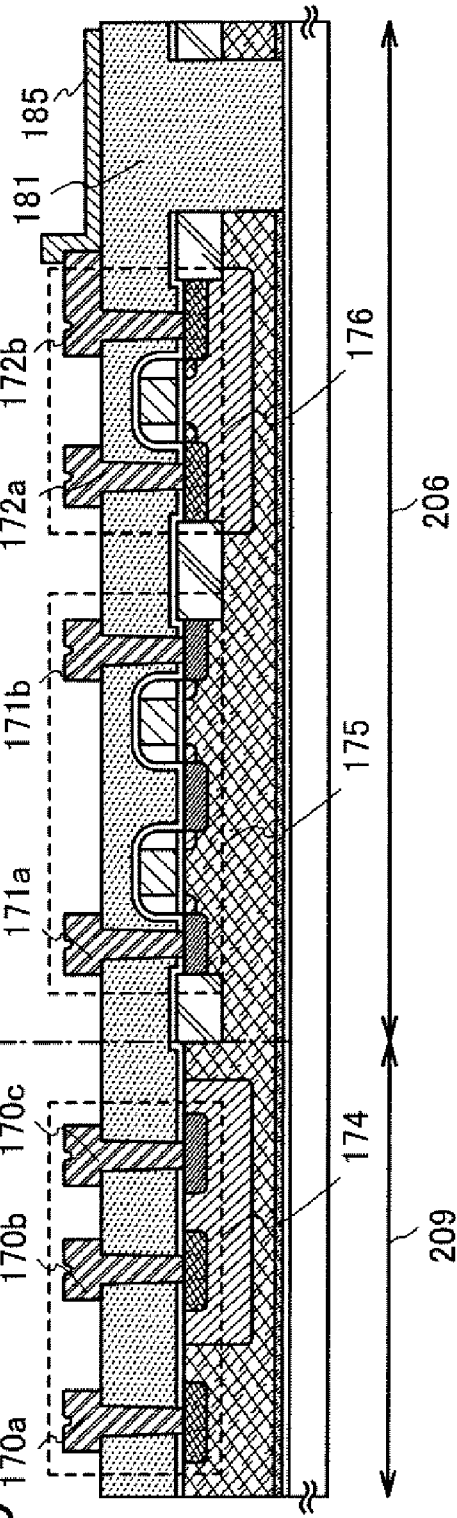

DISPLAY DEVICE

BACKGROUND OF THE INVENTION

1. Field of the Invention

The present invention relates to a display device.

2. Description of the Related Art

Active matrix display devices in which transistors are formed over substrates as pixel switching elements have been developed, and display devices in which polycrystalline silicon is used as semiconductor layers of transistors that drive and control display elements have been put into practical use.

However, polycrystalline silicon is formed in such a way that amorphous silicon is formed by a film formation method and a crystallization process is performed. Therefore, variations of a crystallization state affect characteristics of transistors which are formed. Accordingly, a crystallization condition and a crystallization method such that polycrystalline silicon with more uniform crystallized state is obtained have been researched (e.g., refer to Reference 1: Japanese Published Patent Application No. 2002-124467).

In Reference 1, at the time of laser beam irradiation as a crystallization process, an oxide film is formed over an amorphous silicon film, and effects due to a change and a variation of energy in the laser beam are reduced at the time when crystallization of the amorphous silicon film is performed.

SUMMARY OF THE INVENTION

However, polycrystalline silicon is difficult to obtain a completely uniform crystallization state, and variations in characteristics of transistors to be formed are generated.

When transistors having such characteristic variations are used for a display device, defects occur such that image quality is decreased because display unevenness occurs in an obtained image and such that reliability and yield are also decreased because quality of the display device to be manufactured has variations.

Therefore, an object of the present invention is to provide a display device which includes a transistor having uniform characteristics and which prevents display unevenness, decrease in image quality, and the like and has high image quality and high reliability.

As a semiconductor layer, a single-crystal semiconductor layer which is separated from a single-crystal semiconductor substrate that is a silicon wafer manufactured by thinly slicing an ingot of a single-crystal semiconductor and which is bonded to a supporting substrate of light-transmitting properties having an insulating surface is used. In the present invention, "light-transmitting properties" refer to properties in which light emitted from a light-emitting element passes through and at least visible light passes through.

Further, a reference circuit having a bipolar transistor is provided over the same substrate as a pixel region. For the semiconductor layer of transistors in the reference circuit and the pixel region, a single-crystal semiconductor layer transposed from the above single-crystal semiconductor substrate is used, and it is preferable that the thickness of the single-crystal semiconductor layer be more than or equal to 1 μm and less than or equal to 3 μm. When the above thickness is used and a complementary metal oxide semiconductor (CMOS) is formed in the pixel region and the reference circuit, a bipolar transistor (also referred to as a parasitic bipolar transistor because it can be formed in the same process) can be formed in the reference circuit in the same process. The reference circuit can be used as a reference circuit which compensates temperature dependence of a driving transistor which is driven by supplying current to a light-emitting element of a pixel. Since a reference current generation circuit using a bipolar transistor has very small dependence on temperature, the reference current generation circuit has an effect as a reference circuit which is used to make the drive current of a driving transistor constant without depending on temperature.

In bonding the supporting substrate to the single-crystal semiconductor layer, a silicon oxide film is preferably used which is formed using organic silane as a material on one or both surfaces that are to form a bond. Examples of organic silane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). That is, a layer which forms a smooth surface and has a hydrophilic surface is provided, as a bonding surface, in a structure in which a single-crystal semiconductor layer is bonded to a supporting substrate.

The single-crystal semiconductor layer bonded to the supporting substrate is obtained by being split at a separation layer formed in the single-crystal semiconductor substrate. The separation layer can be formed by being irradiated with ions of hydrogen, helium, or a halogen typified by fluorine. In this case, irradiation may be performed with ions of the same type of atoms but different masses or ions of different types of atoms and different masses. In the case where irradiation is performed using hydrogen ions, it is preferable that $H^+$, $H_2^+$, and $H_3^+$ ions be contained and the percentage of $H_3^+$ ions be increased.

The supporting substrate may be provided with a silicon nitride film or a silicon nitride oxide film which prevents diffusion of an impurity element as a blocking layer (also referred to as a barrier layer). Further, a silicon oxynitride film may be combined as an insulating film which has a function to relieve stress.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

One mode of a display device of the present invention includes a pixel region and a reference circuit each provided over a light-transmitting substrate having an insulating surface, a transistor in the pixel region, and a bipolar transistor in the reference circuit. The transistor in the pixel region and the bipolar transistor in the reference circuit are formed of a continuous single-crystal semiconductor layer. The transistor and the bipolar transistor are electrically isolated from each other by an element isolation region. The transistor in the pixel region is electrically connected to a light-emitting element. The single-crystal semiconductor layer is provided with an opening in a region overlapped with the light-emitting element.

One mode of a display device of the present invention includes a pixel region and a reference circuit each provided over a light-transmitting substrate having an insulating surface, a transistor in the pixel region, and a bipolar transistor in the reference circuit. The transistor in the pixel region and the bipolar transistor in the reference circuit are formed of a continuous single-crystal semiconductor layer. The transistor and the bipolar transistor are electrically isolated from each other by an element isolation region. The transistor in the pixel region is electrically connected to a light-emitting element, and the single-crystal semiconductor layer is provided with an opening in a region overlapped with the light-emitting element. The single-crystal semiconductor layer is bonded to the light-transmitting substrate having an insulating surface using a silicon oxide film that is formed using an organic silane gas by a chemical vapor deposition method.

One mode of a display device of the present invention includes a pixel region and a reference circuit each provided over a light-transmitting substrate having an insulating surface, a transistor in the pixel region, and a bipolar transistor in the reference circuit. The transistor in the pixel region and the bipolar transistor in the reference circuit are formed of a continuous single-crystal semiconductor layer. The transistor and the bipolar transistor are electrically isolated from each other by an element isolation region. The transistor in the pixel region is electrically connected to a light-emitting element, and the single-crystal semiconductor layer is provided with an opening in a region overlapped with the light-emitting element. The opening is filled with an insulating layer.

One mode of a display device of the present invention includes a pixel region and a reference circuit each provided over a light-transmitting substrate having an insulating surface, a transistor in the pixel region, and a bipolar transistor in the reference circuit. The transistor in the pixel region and the bipolar transistor in the reference circuit are formed of a continuous single-crystal semiconductor layer. The transistor and the bipolar transistor are electrically isolated from each other by an element isolation region. The transistor in the pixel region is electrically connected to a light-emitting element, and the single-crystal semiconductor layer is provided with an opening in a region overlapped with the light-emitting element. The single-crystal semiconductor layer is bonded to the light-transmitting substrate having an insulating surface using a silicon oxide film that is formed using an organic silane gas by a chemical vapor deposition method. The opening is filled with an insulating layer.

For the above light-emitting element, an organic light-emitting material or an inorganic light-emitting material which emits light called electroluminescence (hereinafter also referred to as "EL") can be used, and a structure in which a layer that contains an organic matter, an inorganic matter, or a mixture of an organic matter and an inorganic matter is interposed between electrodes can be used.

In the above structure, a driver circuit region may be provided over the light-transmitting substrate having an insulating surface, and a single-crystal semiconductor layer transposed from a single-crystal substrate can be used for a semiconductor of a transistor provided in the driver circuit region.

Note that a display device in the present invention may also mean a display panel itself where a plurality of pixels including display elements such as light-emitting elements and a peripheral driver circuit for driving the pixels are formed over a substrate. Furthermore, the display device may include a display panel to which a flexible printed circuit (FPC) or a printed wiring board (PWB) (e.g., having an IC, a resistor, a capacitor, an inductor, or a transistor) is attached. Such a display device may further include an optical sheet such as a polarizing plate or a retardation plate. Further, it may include a backlight unit (which may include a light guide plate, a prism sheet, a diffusion sheet, a reflective sheet, and a light source (e.g., an LED or a cold-cathode tube)).

The single-crystal semiconductor layer which is separated from a single-crystal semiconductor substrate, and bonded to and provided over a supporting substrate is used, whereby a transistor having uniform characteristics can be formed.

Further, the reference circuit having a bipolar transistor is provided, whereby temperature dependence of a driving transistor which is driven by supplying current to the light-emitting element of a pixel is compensated.

Accordingly, a display device which prevents display unevenness, decrease in image quality, and the like and has high image quality and high reliability can be provided.

BRIEF DESCRIPTION OF THE DRAWINGS

FIGS. 2A to 2C are diagrams illustrating a method for manufacturing a display device of the present invention.

FIGS. 3A to 3C are diagrams illustrating a method for manufacturing a display device of the present invention.

FIGS. 5A to 5C are diagrams illustrating a method for manufacturing a display device of the present invention.

DETAILED DESCRIPTION OF THE INVENTION

Figure 1A:
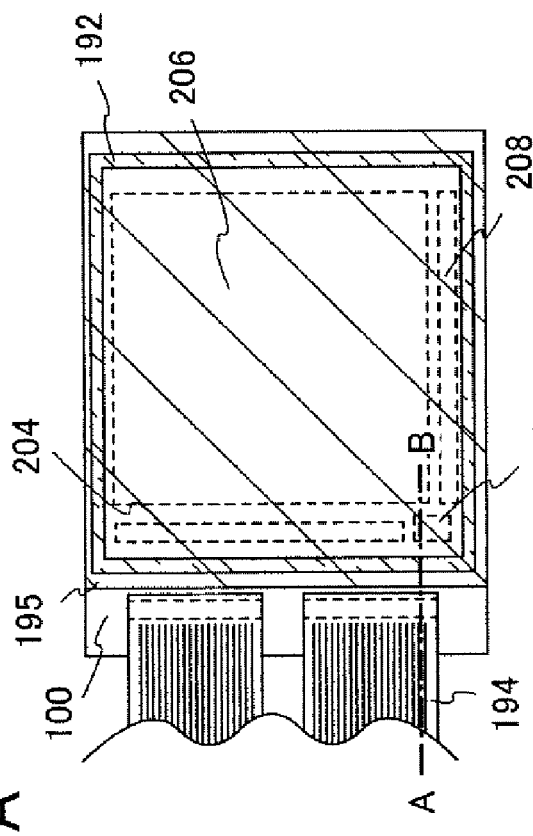
FIGS. 1A and 1B are diagrams illustrating a display device of the present invention.

Hereinafter, embodiment modes of the present invention will be described using the accompanying drawings in detail. However, the present invention can be implemented in various modes. As can be easily understood by those skilled in the art, the modes and details of the present invention can be changed in various ways without departing from the spirit and scope of the present invention. Thus, the present invention should not be taken as being limited to the following description of the embodiment modes. Note that the same reference numerals are used in common to denote the same component or a component which has a similar function among different drawings in structures of the present invention explained below, and repetitive description thereof is omitted.

Embodiment Mode 1

In this embodiment modes a display device for high image quality and high reliability and a method for manufacturing the display device will be described in detail with reference to FIGS. 1A and 1B, 2A to 2C, 3A to 3C, 4A to 4C, 5A to 5C, 6A to 6D, 7A to 7C, 9A and 9B and 10A to 10C.

Figure 10A:
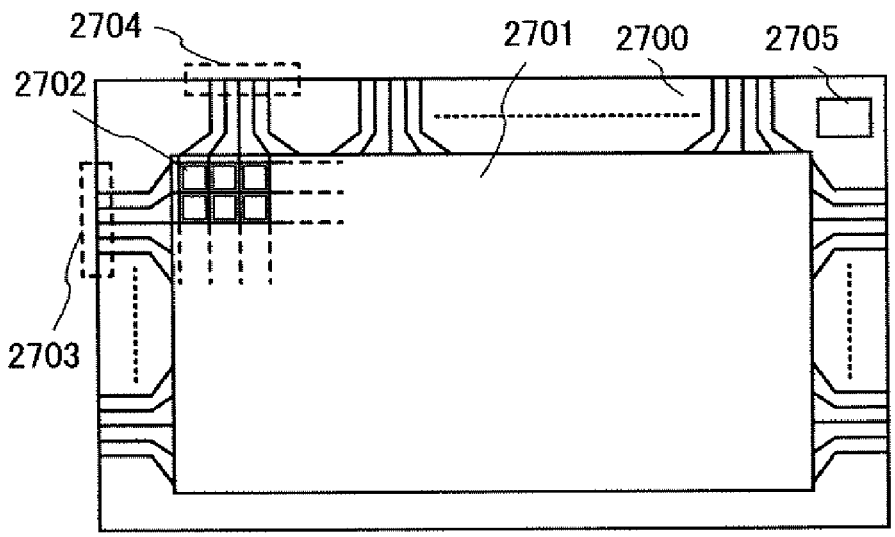
FIGS. 10A to 10C are top views of a display device of the present invention.

FIG. 10A is a top view illustrating a structure of a display panel of the present invention. A pixel region 2701 in which pixels 2702 are arranged in matrix, a scan line input terminal 2703, a signal line input terminal 2704, and a reference circuit 2705 are formed over a substrate 2700 having an insulating surface. The number of pixels may be decided according to various standards: if the standard is XGA, the number of pixels may be 1024×768×3 (RGB); if the standard is UXGA, the number of pixels may be 1600×1200×3 (RGB); and if the display panel is for full-spec high vision, the number of pixels may be 1920×1080×3 (RGB).

A scan line extended from the scan line input terminal 2703 and a signal line extended from the signal line input terminal 2704 intersect each other, whereby the pixels 2702 are arranged in matrix. Each of the pixels 2702 has a switching element and a pixel electrode layer connected thereto. A typical example of the switching element is a TFT. Connecting the scan line to a gate electrode layer side of a TFT and the signal line to a source or drain side of the TFT enables separate control of each pixel by a signal that is input from the outside.

In FIG. 10A, a structure of the display panel which controls a signal to be input into the scan line and the signal line by the external driver circuit is shown. However, a driver IC may be provided on the substrate by a COG (chip on glass) method. As another embodiment mode, a TAB (tape automated bonding) method may be used.

Figure 10B:
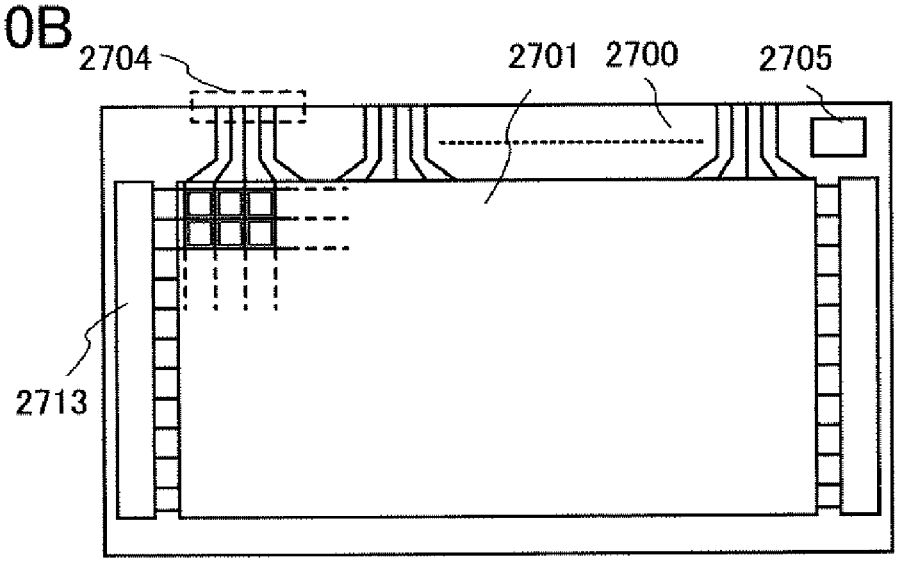

As shown in FIG. 10B, a scan line driver circuit 2713 can be formed over the substrate 2700. In FIG. 10B, the pixel region 2701 is controlled by an external driver circuit in a similar manner to the case of FIG. 10A in which the pixel region 2701 is connected to the signal line input terminal 2704. In addition, as shown in FIG. 10C, the pixel region 2701, the scan line driver circuit 2713, and a signal line driver circuit 2714 can be formed over the substrate 2700.

Figure 10C:
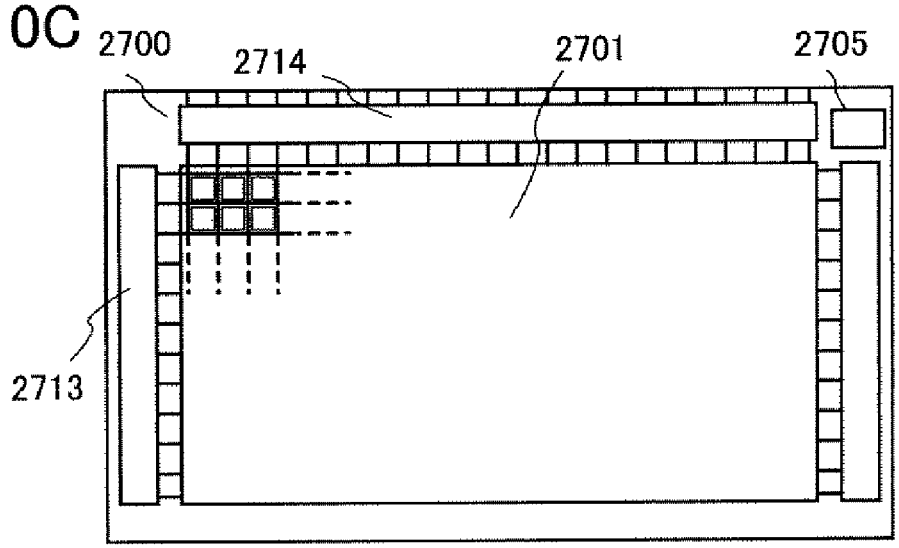

In FIGS. 10A to 10C, the reference circuit 2705 having a bipolar transistor is provided over the substrate 2700. In this embodiment mode, the reference circuit 2705 can be used as a reference circuit which compensates temperature dependence of a driving transistor which is driven by supplying current to a light-emitting element of a pixel. Since a reference current generation circuit using a bipolar transistor has very small temperature dependence, the reference current generation circuit has an effect as a reference circuit which is used to make drive current of the driving transistor constant without depending on temperature.

A method for providing a single-crystal semiconductor layer from a single-crystal semiconductor substrate over a light-transmitting substrate having an insulating surface will be described with reference to FIGS. 6A to 6D, and FIG. 7A to 7C.

Figure 6A:
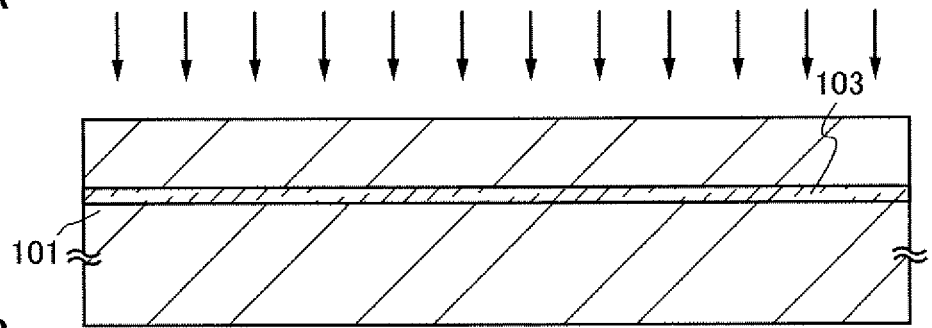
FIGS. 6A to 6D are diagrams illustrating a method for manufacturing a display device of the present invention.

A semiconductor substrate 101 shown in FIG. 6A is purified, irradiation of ions accelerated by an electric field is performed at a given depth from a surface of the semiconductor substrate 101, and a separation layer 103 is formed. Ion irradiation is performed in consideration of the thickness of a single-crystal semiconductor layer that is transposed to a supporting substrate. It is preferable that the thickness of the single-crystal semiconductor layer be more than or equal to 1 μm and less than or equal to 3 μm. In consideration of such thickness, an acceleration voltage at the time of ion irradiation is set so that the semiconductor substrate 101 is irradiated with ions.

For the semiconductor substrate 101, a p-type or n-type single-crystal silicon substrate (silicon wafer) is used as a typical example. For another single-crystal semiconductor substrate, a substrate of silicon or germanium, or of a semiconductor compound such as gallium arsenic or indium phosphide can be used. In this embodiment mode, hydrogen or fluorine is added to the given depth of the single-crystal semiconductor substrate by ion irradiation, and then, heat treatment is performed and a single-crystal silicon layer of a surface layer is separated by an ion irradiation separation method; however, a method in which single-crystal silicon is epitaxially grown over porous silicon, and then, a porous silicon layer is separated by water jet may be used.

The separation layer may be irradiated with ions by an ion doping method or an ion implantation process. The separation layer is formed in such a way that the ions of hydrogen, helium, or a halogen typified by fluorine are added. When fluorine ions are irradiated as a halogen element, $BF_3$ may be used as a source gas. Note that an ion implantation process refers to a method in which an ionized gas is mass-separated to irradiate a semiconductor.

When the single-crystal silicon substrate is irradiated with halogen ions such as fluorine ions, fluorine which is added knocks out (ejects) silicon atoms in silicon crystal lattices, whereby a blank portion is effectively formed, and microvoids are formed in the separation layer. In this case, a change occurs in the volume of microvoids formed in the separation layer by heat treatment at a relatively low temperature, and separation is performed along the separation layer, whereby a thin single-crystal semiconductor layer can be formed. After irradiation of fluorine ions, hydrogen ions may be irradiated and hydrogen may be contained in the voids. Since separation is performed using the change in the volume of the microvoids formed in the separation layer, it is preferable that the separation layer which is formed to separate a thin semiconductor layer from the semiconductor substrate make good use of operation of fluorine ions or hydrogen ions.

Irradiation may be performed with ions of the same type of atoms but different masses or ions of different types of atoms and different masses. For example, in the case where irradiation is performed using hydrogen ions, it is preferable that $H^+$, $H_2^+$, and $H_3^+$ ions be contained and the percentage of $H_3^+$ ions be high. In the case where irradiation is performed using hydrogen ions, when $H^+$, $H_2^+$, and $H_3^+$ ions are contained and the percentage of $H_3^+$ ions is high, irradiation efficiency can be improved and irradiation time can be shortened. With such a structure, separation can be easily performed.

It is necessary to irradiate ions under high dose conditions in the formation of the separation layer and the surface of the semiconductor substrate 101 becomes rough in some cases. Therefore, the surface to be irradiated with ions may be provided with a protective film having a thickness of 50 nm to 200 nm with respect to ion irradiation by using a silicon nitride film, a silicon nitride oxide film, or the like. In addition, the semiconductor substrate 101 may be defatted and washed, the oxide film at the surface may be removed, and thermal oxidation may be performed. As thermal oxidation, although normal dry oxidation may be used, it is preferable that oxidation doped with halogen in an oxidative atmosphere be performed. For example, in an atmosphere that contains 0.5 volume % to 10 volume % (preferably 3 volume %) of HCl with respect to oxygen, heat treatment is performed at a temperature of 700° C. or more. Thermal oxidation is preferably performed at a temperature of 950° C. to 1100° C. Processing time may be set for 0.1 to 6 hours, preferably, 0.5 to 1 hour. The thickness of the oxide film to be formed is 10 nm to 1000 nm (preferably, 50 nm to 200 nm), and for example, the thickness is 100 nm.

As a material which contains halogen, one or plural kinds selected from HF, $NF_3$, HBr, $Cl_2$, $ClF_3$, $BCl_3$, $F_2$, $Br_2$, dichloroethylene, and the like can be applied as well as HCl.

Heat treatment is performed in such a temperature range, whereby a gettering effect due to a halogen element can be obtained. In particular, the gettering has an effect to remove a metal impurity. That is, by operation of chlorine, an impurity such as metal is separated and removed as volatile chloride into the vapor phase. The gettering is effective in one in which the surface of the semiconductor substrate 101 is subjected to chemical mechanical polishing (CMP) treatment. Hydrogen has an operation to compensate a defect at the interface between the semiconductor substrate 101 and the oxide film which is to be formed and to reduce local level density at the interface, and the interface between the semiconductor substrate 101 and the oxide film is inactivated to stabilize electric characteristics.

Halogen can be contained in the oxide film formed by this heat treatment. A halogen element is contained at a concentration of $1 \times 10^{17}/cm^3$ to $5 \times 10^{20}/cm$, whereby an impurity such as metal can be captured and a function as the protective film which prevents contamination of the semiconductor substrate 101 can be generated.

Figure 6B:
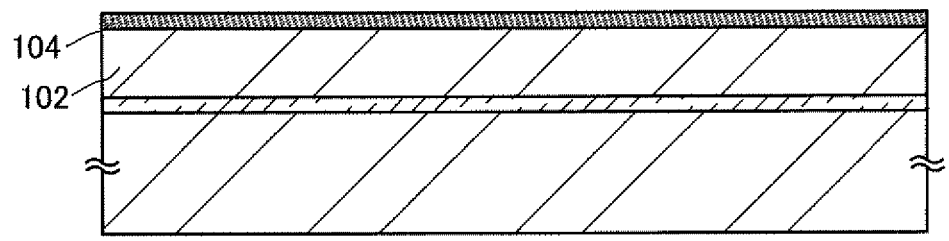

Next, as shown in FIG. 6B, a silicon oxide film is formed as an insulating layer (bonding layer) 104 having a bonding surface at a surface at which a bond between the supporting substrate and the insulating layer 104 is formed. As the silicon oxide film, a silicon oxide film formed by a chemical vapor deposition method using an organic silane gas is preferable. In addition, a silicon oxide film formed using a silane gas by a chemical vapor deposition method can be used. In a film formation by a chemical vapor deposition method, as a temperature that does not have degas from the separation layer 103 formed in the single-crystal semiconductor substrate, a film formation temperature of 350° C. or less can be used, for example. For heat treatment in which a single-crystal semiconductor layer is separated from a single-crystal semiconductor substrate or a polycrystalline semiconductor substrate, heat-treatment temperature which is higher than film formation temperature is used.

The insulating layer 104 forms a smooth surface and has a hydrophilic surface. A silicon oxide film is suitable for use as the insulating layer 104. In particular, a silicon oxide film formed by a chemical vapor deposition method using an organic silane gas is preferable. Examples of organic silane gas that can be used include silicon-containing compounds, such as tetraethoxysilane (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$). In addition, a silicon oxide film formed using a silane gas by a chemical vapor deposition method can be used. In a film formation by a chemical vapor deposition method, as a temperature that does not have degas from the separation layer 103 formed in the semiconductor substrate, a film formation temperature of 350° C. or less can be used, for example. For heat treatment in which a single-crystal semiconductor layer is separated from a single-crystal semiconductor substrate or a polycrystalline semiconductor substrate, heat-treatment temperature which is higher than film formation temperature is used.

The insulating layer 104 which forms a smooth surface and has a hydrophilic surface is provided at a thickness of 5 nm to 500 nm. With such a thickness, it is possible to smooth surface roughness of a surface on which a film is to be formed and also to ensure smoothness of a growing surface of the film. In addition, it is possible to mitigate distortion of the substrate to be bonded. A supporting substrate 100 may also be provided with a similar silicon oxide film. In other words, in bonding the supporting substrate 100 to a single-crystal semiconductor layer 102, the insulating layer 104 is provided using a silicon oxide film which is formed preferably using organic silane as a material on one or both surfaces that are to form a bond, whereby a strong bond can be formed.

Figure 6C:
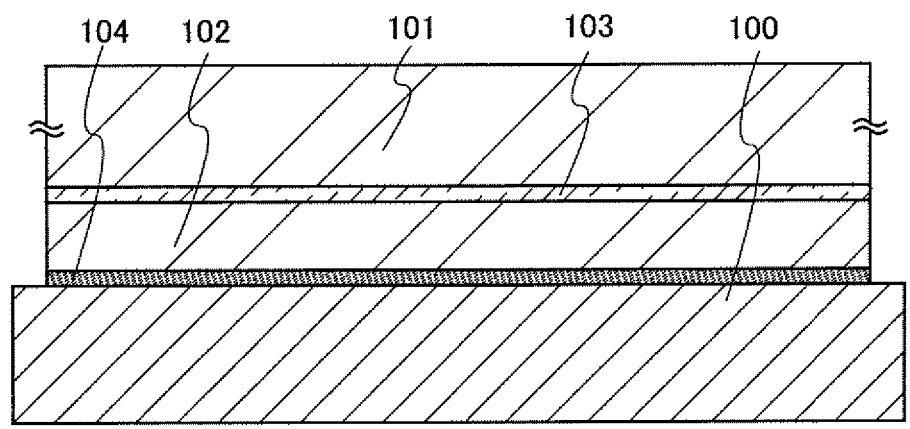

FIG. 6C shows a mode in which the supporting substrate 100 is placed close to the surface forming the insulating layer 104 over the semiconductor substrate 101 to bond the two to each other. A surface which is to form a bond is cleaned sufficiently. Then, when the supporting substrate 100 and the insulating layer 104 are faced to each other and one portion is pushed from the outside, the supporting substrate 100 and the insulating layer 104 are attracted to each other due to increase in Van der Waals forces and contribution of hydrogen bonding because a distance between bonding surfaces is locally decreased. Further, since a distance between the supporting substrate 100 and the insulating layer 104 which face each other is also decreased in an adjacent region, a region in which Van der Waals forces strongly act or a region in which hydrogen bonding is involved is increased, whereby bonding proceeds to the whole bonding surface.

In order to form a favorable bond, the surface may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such a surface treatment makes it easy to form a bond between different kinds of materials even if temperature is at 200° C. to 400° C.

A process in which a single-crystal semiconductor layer is separated from a semiconductor substrate, and a process in which the glass substrate and the single-crystal semiconductor layer are strongly bonded together may be performed by separate heat treatment or in one heat treatment at the same time.

After the supporting substrate 100 and the semiconductor substrate 101 are bonded to each other with the insulating layer 104 interposed therebetween, it is preferable that heat treatment or pressure treatment be performed. Heat treatment or pressure treatment makes it possible to increase bonding strength. The pressure treatment is performed so that pressure is applied perpendicular to the bonding surface, in consideration of the pressure resistance of the supporting substrate 100 and the semiconductor substrate 101.

Figure 6D:
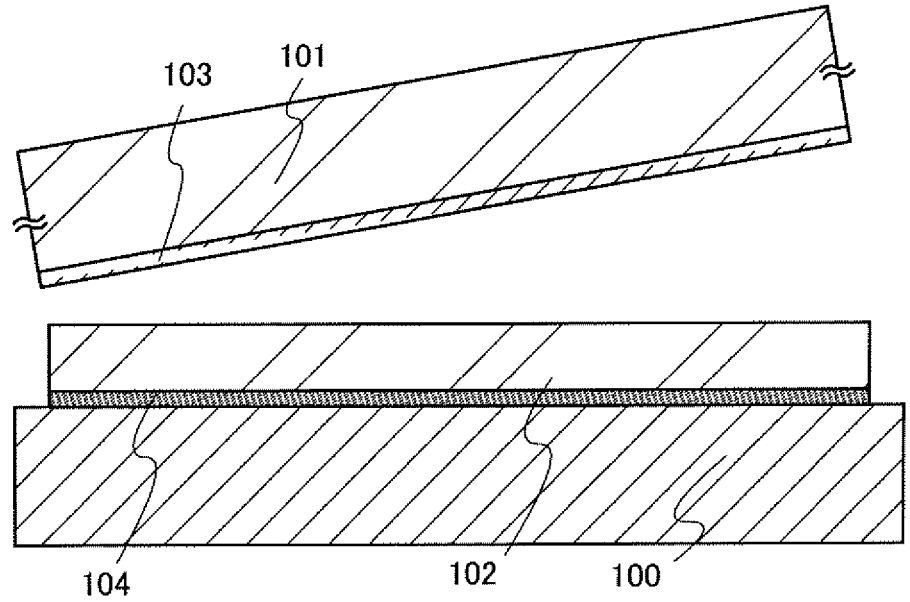

In FIG. 6D, after the supporting substrate 100 and the semiconductor substrate 101 are bonded together, heat treatment is performed to separate the semiconductor substrate 101 from the supporting substrate 100 with the separation layer 103 used as a separation plane. When the heat treatment is performed at, for example, 400° C. to 600° C., a change occurs in the volume of microvoids formed in the separation layer 103, which enables separation to be generated along the separation layer 103. In this embodiment mode, heat treatment temperature is set at lower temperature than the heat treatment which has been performed on the supporting substrate 100 in advance. Because the insulating layer 104 is bonded to the supporting substrate 100, the single-crystal semiconductor layer 102 having the same crystallinity as the semiconductor substrate 101 is left remaining over the supporting substrate 100.

Figure 7A:
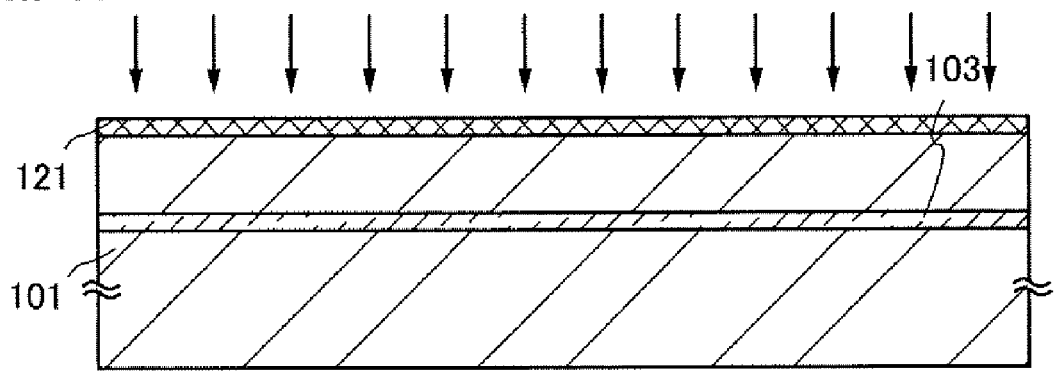
FIGS. 7A to 7C are diagrams illustrating a method for manufacturing a display device of the present invention.
Figure 7B:
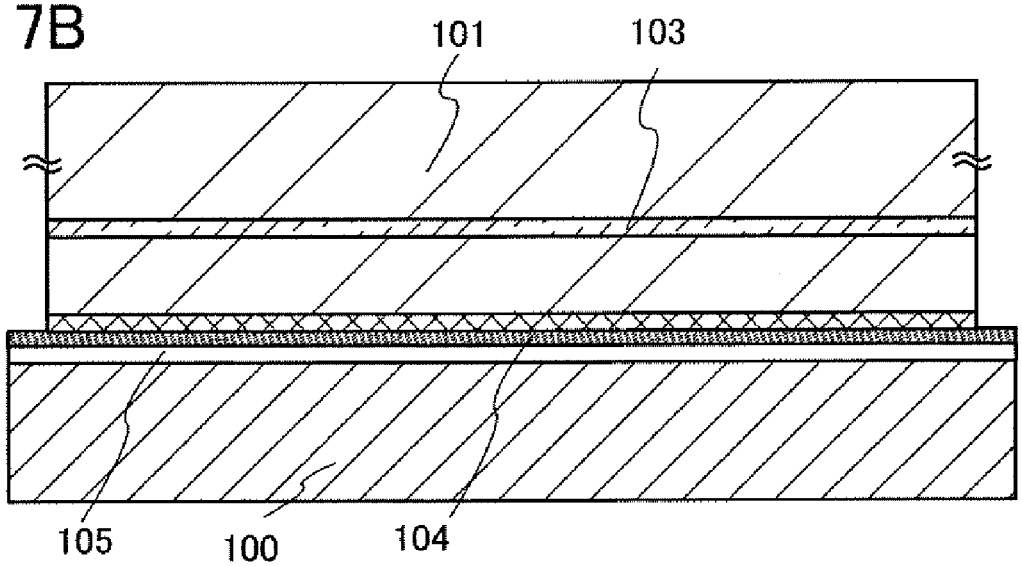
Figure 7C:
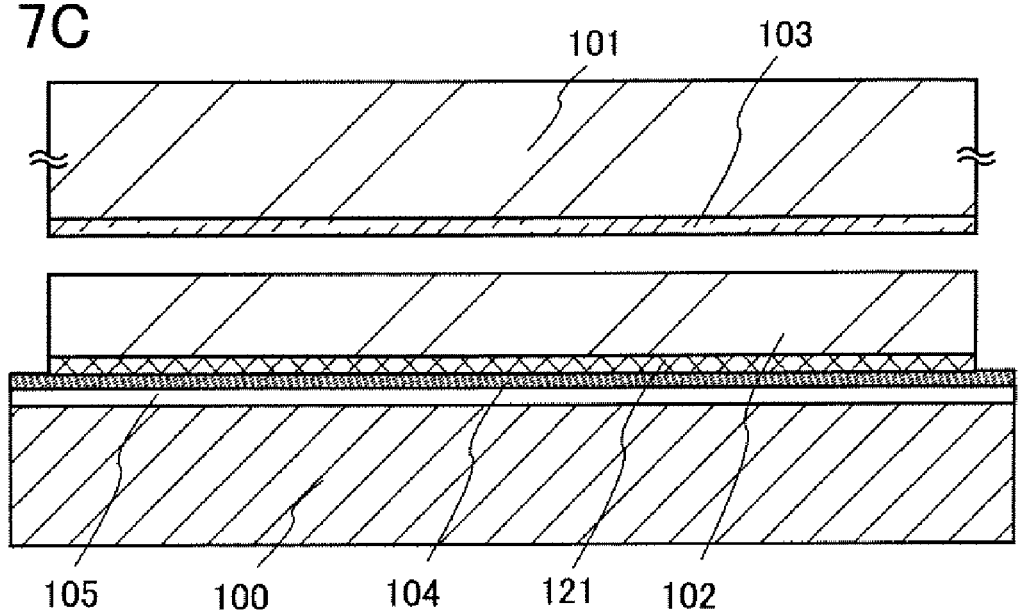

FIGS. 7A to 7C show steps of forming a single-crystal semiconductor layer provided with an insulating layer having a bonding surface provided on the supporting substrate 100 side. FIG. 7A shows a step in which the semiconductor substrate 101 provided with a silicon oxide film 121 is irradiated with ions that are accelerated by an electric field at a given depth to form the separation layer 103. The ion irradiation is performed similarly to the case shown in FIG. 6A. Formation of the silicon oxide film 121 over the surface of the semiconductor substrate 101 can prevent the surface from being damaged by ion irradiation and from losing its planarity. In addition, an effect to prevent diffusion of impurities with respect to the single-crystal semiconductor layer 102 that is formed from the semiconductor substrate 101 by using the silicon oxide film 121 appears.

FIG. 7B shows a step in which the supporting substrate 100 provided with a blocking layer 105 and the insulating layer 104 is placed close to the surface forming the silicon oxide film 121 over the semiconductor substrate 101 to form a bond. Then, when the insulating layer 104 and the silicon oxide film 121 are faced to each other and one portion is pushed from the outside, the insulating layer 104 and the silicon oxide film 121 are attracted to each other due to increase in Van der Waals forces and contribution of hydrogen bonding because a distance between bonding surfaces is locally decreased. Further, since a distance between the insulating layer 104 and the silicon oxide film 121 which face each other is also decreased in an adjacent region, a region in which Van der Waals forces strongly act or a region in which hydrogen bonding is involved is increased, whereby bonding proceeds to the whole bonding surface.

After that, the semiconductor substrate 101 is separated from the supporting substrate 100, as shown in FIG. 7C. Heat treatment for separating the single-crystal semiconductor layer from the supporting substrate 100 is performed similarly to the case shown in FIG. 6D. The temperature of heat treatment in a bonding and separating process is set at the temperature of less than or equal to the heat treatment which has been performed on the supporting substrate 100 in advance. Accordingly, the semiconductor substrate shown in FIG. 7C can be obtained.

As the supporting substrate 100, a light-transmitting substrate having an insulating surface can be used, and for example, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In addition, quartz glass may be used as well. In other words, a single-crystal semiconductor layer can be formed over a substrate that is longer than one meter on each side. With the use of such a large-area substrate, not only a display device such as a liquid crystal display but also a semiconductor integrated circuit can be manufactured.

As described in the above process, the blocking layer 105 and the insulating layer 104 are provided over the supporting substrate 100 which is a light-transmitting substrate having an insulating surface, and the single-crystal semiconductor layer 102 which is a single-crystal semiconductor layer is formed (see FIG. 2A).

As for the single-crystal semiconductor layer 102, there are no particular limitations on the single-crystal semiconductor layer 102 as long as it is a single-crystal semiconductor, and for example, single-crystal silicon having n-type or p-type conductivity, a compound semiconductor (e.g., a GaAs substrate, an InP substrate, or a SiC substrate), or the like can be used. The single-crystal semiconductor layer can be determined by selecting a single-crystal semiconductor substrate that serves as a base.

First, an insulating layer 108 is formed over the single-crystal semiconductor layer 102. Here, as the single-crystal semiconductor layer 102, single-crystal silicon having p-type conductivity is used, and the insulating layer 108 is formed over the single-crystal semiconductor layer 102. For example, by performing heat treatment on the single-crystal semiconductor layer 102, a silicon oxide film and a silicon nitride film formed over the silicon oxide film by a CVD method are stacked as the insulating layer 108. In this embodiment mode, a silicon oxide film is formed as the insulating layer 108. Note that the insulating layer may be formed of a single layer or a stacked structure having three or more layers, over the single-crystal semiconductor layer 102.

Next, a pattern of a mask 111 is selectively formed over the insulating layer 108, the mask 111 is used as a mask, and an impurity element which imparts n-type conductivity is added to the single-crystal semiconductor layer 102 as an impurity element 109 to form n-wells 110a and 110b (see FIG. 2B). As the impurity element which imparts n-type conductivity, phosphorus (P), arsenic (As), or the like can be used.

Next, the mask 111 is removed, and an insulating layer 112 is formed over the insulating layer 108. In this embodiment mode, a silicon nitride film is formed by a CVD method as the insulating layer 112.

Next, a mask is selectively formed over the insulating layer 112. Etching is selectively performed by using the mask, whereby depressions are selectively formed in the single-crystal semiconductor layer 102 (see FIG. 2C). As the etching of the single-crystal semiconductor layer 102, the insulating layers 108 and 112, dry etching using plasma can be used.

Next, after the mask is removed, an insulating layer is formed so as to fill the depressions formed in the single-crystal semiconductor layer 102. The insulating layer is formed using an insulating material such as silicon oxide, silicon nitride, silicon oxynitride, or silicon nitride oxide by a CVD method or a sputtering method. Here, a silicon oxide layer is formed as the insulating layer with the use of a TEOS (tetraethylorthosilicate) gas by an atmospheric pressure CVD method or a low pressure CVD method.

Next, a surface of the single-crystal semiconductor layer 102 is exposed by performing grinding treatment, polishing treatment, or CMP (chemical mechanical polishing) treatment. When the surface of the single-crystal semiconductor layer 102 is exposed, insulating layers 114a, 114b, and 114c which function as element isolation regions are each provided in the depressions of the single-crystal semiconductor layer 102 (see FIG. 3A). Note that the insulating layers 114a, 114b, and 114c are obtained by removing the insulating layer formed over the surface of the single-crystal semiconductor layer 102 by grinding treatment, polishing treatment, or CMP treatment.

Note that, although addition of an impurity element which imparts p-type conductivity is not performed because the single-crystal semiconductor layer which is separated from the p-type semiconductor substrate and bonded to the supporting substrate is used as the single-crystal semiconductor layer 102 in this embodiment mode, a p-well may be formed by addition of an impurity element which imparts p-type conductivity. As the impurity element which imparts p-type conductivity, boron (B), aluminum (Al), gallium (Ga), or the like can be used.

Meanwhile, when a single-crystal semiconductor layer having n-type conductivity is used, an impurity element which imparts p-type conductivity may be added to form a p-well.

Next, an insulating layer 115a and an insulating layer 115b are formed (see FIG. 3B). The insulating layers 115a and 115b are formed by performing high density plasma treatment on the single-crystal semiconductor layer 102. The high density plasma treatment is performed in such a way that a first feed gas that contains a noble gas, oxygen, and hydrogen is used first, and then, the first feed gas is switched to a second feed gas that contains a noble gas and oxygen. The first feed gas is preferably supplied such that a flow ratio of a noble gas:oxygen:hydrogen is within the range of 100:1:1 to 200:1:1. In addition, for the high density plasma treatment using the first feed gas, it is preferable to form an insulating layer having a thickness of 8 nm or more. The second feed gas is preferably supplied such that a flow ratio of a noble gas: oxygen is within the range of 100:1 to 200:1. Note that the second feed gas may contain hydrogen as long as a ratio of hydrogen to oxygen is within the range of one-fifth. In addition, it is preferable that time of high density plasma treatment using the second feed gas be set for 60 seconds or more.

In the high density plasma treatment, plasma which is excited by high-frequency waves such as microwaves (typically, 2.45 GHz) and has an electron density of greater than or equal to $1 \times 10^{11}$ cm$^3$, and an electron temperature of plasma of less than or equal to 1.5 eV is used. Specifically, plasma in which an electron density of greater than or equal to $1 \times 10^{11}$ cm$^{-3}$ and less than or equal to $1 \times 10^{13}$ cm$^3$, and electron temperatures of plasma of greater than or equal to 0.5 eV and less than or equal to 1.5 eV, is preferably used.

For a noble gas supply source used as a feed gas, at least one of helium (He), neon (Ne), argon (Ar), krypton (Kr), and Xe (Xe) can be used. For an oxygen supply source, oxygen ($O_2$), ozone ($O_3$), nitrous oxide ($N_2O$), nitrogen monoxide (NO), or nitrogen dioxide ($NO_2$) can be used. For a hydrogen supply source, hydrogen ($H_2$), water ($H_2O$), or hydrogen peroxide ($H_2O_2$) can be used. Note that when a noble gas is used for a feed gas, a noble gas is contained in the formed insulating layer in some cases.

In this embodiment mode, high density plasma treatment is performed by supplying an Ar gas of 500 sccm to 1000 sccm, an $O_2$ gas of 5 sccm, and an $H_2$ gas of 5 sccm as the first feed gases, and an insulating layer having a thickness of 8 nm is formed. In addition, treatment is performed by supplying an Ar gas of 500 sccm to 1000 sccm and an $O_2$ gas of 5 sccm as the second feed gases for 60 seconds or more. Then, the insulating layers 115a and 115b that contain silicon oxide are formed at a thickness of greater than or equal to 8 n and less than or equal to 20 nm.

Note that each of the insulating layers 115a and 115b formed over the single-crystal semiconductor layer functions as a gate insulating layer in a transistor to be completed later.

In the present invention, a conductive layer for forming a wiring layer or an electrode layer, a mask for forming a given pattern, or the like may also be formed by a method by which a pattern can be selectively formed, such as a droplet discharging method. By a droplet discharging (jetting) method (also called an ink jet method depending on its system), a given pattern (such as a conductive layer or an insulating layer) can be formed by selectively discharging (jetting) droplets of a composition which is prepared for a particular purpose. At this time, treatment for controlling wettability or adhesion may be performed to a formation region. Alternatively, a method by which a pattern can be transferred or drawn, for example, a printing method (a method by which a pattern can be formed, such as screen printing or offset printing), or the like can be used.

In this embodiment mode, for a mask, a resin material such as an epoxy resin, an acrylic resin, a phenol resin, a novolac resin, a melamine resin, or a urethane resin is used. Alternatively, an organic material such as benzocyclobutene, parylene, fluorinated arylene ether, or polyimide, a compound material formed by polymerization of siloxane-based polymers or the like, and the like can be used. Further alternatively, a commercially-available resist material containing a photosensitizer such as a positive-type resist or a negative-type resist may also be used. Even when a droplet discharging method is used with any material, the surface tension and the viscosity of the material are appropriately adjusted by adjusting the concentration of a solvent or by adding a surfactant or the like.

Next, gate electrode layers 116a, 116b, and 117 are formed over the insulating layers 115a and 115b. A conductive film may be formed and selectively etched using a mask by photolithography or the like to form the gate electrode layers 116a, 116b, and 117. The conductive film can be formed by a sputtering method, an evaporation method, a CVD method, or the like. The conductive film may be formed using an element selected from tantalum (Ta), tungsten (W), titanium (Ti), molybdenum (Mo), aluminum (Al), copper (Cu), chromium (Cr), or neodymium (Nd), or an alloy material or a compound material containing any of these elements as its main component. Further, as the conductive film, a semiconductor film typified by a polycrystalline silicon film doped with an impurity element such as phosphorus, or an AgPdCu alloy may be used. In addition, the conductive film may have not only a single-layer structure but also a stacked-layer structure such as a two-layer structure or a three-layer structure. For example, a stack or the like of a nitride tantalum film and a tungsten film can be used. In addition, the side surfaces of the gate electrode layers 116a, 116b, and 117 may have tapered shapes. With the tapered shape, coverage by a film that is stacked thereover is improved and defects are reduced, whereby reliability is increased.

Next, a mask 156 which covers the gate electrode layer 117 is formed. The mask 156, and the gate electrode layers 116a and 116b are used as masks, an impurity element 159 which imparts n-type conductivity is added to form a first n-type impurity region 142a, a first n-type impurity region 142b, and a first n-type impurity region 142c (see FIG. 3C). In this embodiment mode, phosphorus (P) is used as the impurity element which imparts n-type conductivity.

Next, a mask 157 which covers the gate electrode layers 116a and 116b is formed. The mask 157 and the gate electrode layer 117 are used as masks, and an impurity element 158 which imparts p-type conductivity is added to form a first p-type impurity region 140a and a first p-type impurity region 140b (see FIG. 4A). In this embodiment mode, boron (B) is used as the impurity element which imparts p-type conductivity.

As the impurity element which imparts n-type conductivity, phosphorus (P), arsenic (As), or the like can be used. As the impurity element which imparts p-type conductivity, boron (B), aluminum (Al), gallium (Ga), or the like can be used. Parts of the first n-type impurity region 142a, the first n-type impurity region 142b, the first n-type impurity region 142c, the first p-type impurity region 140a, and the first p-type impurity region 140b that are formed here form LDD (lightly doped drain) regions to be formed later.

Next, insulating layers 145a, 145b, 145c, 145d, 145e, and 145f which are also called sidewalls and come into contact with the side surfaces of the gate electrode layers 116a, 116b, and 117 are formed. The insulating layers 145a, 145b, 145c, 145d, 145e, and 145f can be formed in such a way that an insulating layer is formed by a single layer or a stacked structure using an inorganic material that contains nitrogen or oxygen, such as silicon oxide, silicon nitride, silicon oxynitride, or silicon nitride oxide, or an organic material such as an organic resin by a CVD method or a sputtering method, and the insulating layer is selectively etched by anisotropic etching mainly in a perpendicular direction to come into contact with side surfaces of the gate electrode layers 116a, 116b, and 117. Note that the insulating layers 145a, 145b, 145c, 145d, 145e, and 145f are used as masks for doping when the LDD regions are formed. In this embodiment mode, when the insulating layers 145a, 145b, 145c, 145d, 145e, and 145f are formed, the insulating layers 115a and 115b are selectively etched to form insulating layers 146a, 146b and 146c. The insulating layers 146a, 146b and 146c each function as a gate insulating layer.

Next, a mask 153 which covers the gate electrode layer 117 and the insulating layers 145e and 145f are formed. The mask 153, the gate electrode layers 116a and 116b, the insulating layers 145a, 145b, 145c, and 145d are used as masks, and an impurity element 152 which imparts n-type conductivity is selectively added at a high concentration to form second n-type impurity regions 144, 147a, 147b, and 147c which are high concentration n-type impurity regions, and third n-type impurity regions 148a, 148b, 148c, and 148d which are low concentration n-type impurity regions (see FIG. 4C). In a pixel region 206, the second n-type impurity regions 147a, 147b, and 147c function as source regions and drain regions, and the third n-type impurity regions 148a, 148b, 148c, and 148d function as LDD regions. A channel formation region 130a is formed between the third n-type impurity regions 148a and 148b, and a channel formation region 130b is formed between the third n-type impurity regions 148c and 148d. The second n-type impurity region 144 which is a high concentration n-type impurity region is formed in a reference circuit 209.

Next, a mask 155 which covers the gate electrode layers 116a and 116b, and the insulating layers 145a, 145b, 145c, and 145d is formed. The mask 155, the gate electrode layer 117, the insulating layers 145e and 145f are used as masks. An impurity element 154 which imparts p-type conductivity is selectively added at high concentration to form second p-type impurity regions 160, 161, 163a, and 163b which are high concentration p-type impurity regions, and third p-type impurity regions 162a and 162b which are low concentration p-type impurity regions are formed (see FIG. 5A). In the pixel region 206, the second p-type impurity regions 163a and 163b function as a source region and a drain region, and the third p-type impurity regions 162a and 162b function as LDD regions. A channel formation region 131 is formed between the third p-type impurity regions 162a and 162b. The second p-type impurity regions 160 and 161 which are high concentration p-type impurity regions are formed in the reference circuit 209.

In this embodiment mode, an insulating film 132 is formed as a passivation film which covers the gate electrode layer and the single-crystal semiconductor layer. The insulating film 132 is used as an insulating film that contains hydrogen, and an insulating film that contains hydrogen is formed as the insulating film 132 in this embodiment mode. The insulating film 132 can be formed using a silicon nitride film, a silicon nitride oxide film, a silicon oxynitride film, a silicon oxide film, or the like by a sputtering method or a plasma CVD method. The insulating film 132 may be formed using a single layer or a stacked structure having three or more layers of another insulating film that contains silicon.

As an insulating film that contains hydrogen is used as the insulating film 132, heat treatment may be performed at 300° C. to 550° C. for 1 to 12 hours in a nitrogen atmosphere, and a process for hydrogenating the semiconductor layer may be performed. It is preferable that heat treatment be performed at 400° C. to 500° C. (e.g., at 410 for 1 hour). Through this process, the dangling bond of the semiconductor layer can be terminated by hydrogen which is contained in the insulating film that contains hydrogen.

Next, in the pixel region 206, the single-crystal semiconductor layer which is overlapped with a region where a light-emitting element is formed is removed, and an opening 169 is formed. This is because light emitted from the light-emitting element is extracted from the supporting substrate 100. In the opening 169, at least the single-crystal semiconductor layer which interrupts light should be removed, and the insulating layer having a bonding surface or the blocking layer may be left as long as the insulating layer or the blocking layer has light-transmitting properties. In this embodiment mode, the blocking layer 105 is used as an etching stopper, and the single-crystal semiconductor layer and the insulating layer having a bonding surface are selectively removed. For the etching, wet etching, dry etching, or the both may be employed.

Next, an interlayer insulating layer is formed. In this embodiment mode, an insulating layer 181 is formed (see FIG. 5C). In this embodiment mode, the opening 169 is filled with the insulating layer 181; therefore, it is preferable that the insulating layer 181 be formed using a wet method to be planarized. In addition, e insulating layer is formed using a dry method to fill the opening 169, and then, etching may be performed for planarization. Since the insulating layer 181 needs to transmit light emitted from the light-emitting element, the insulating layer 181 has light-transmitting properties. The insulating layer 181 may be formed using a silicon nitride film, a silicon nitride oxide film, a silicon oxynitride film, or a silicon oxide film, by a sputtering method or a plasma CVD method. The insulating layer 181 may be formed using a single layer or a stacked structure having three or more layers of another insulating film that contains silicon.

The insulating layer 181 can also be formed using a material selected from aluminum nitride (AlN), aluminum oxynitride (AlON), aluminum nitride oxide (AlNO), which contains more nitrogen than oxygen, aluminum oxide, diamond-like carbon (DLC), carbon containing nitrogen (CN), and other substances containing an inorganic insulating material. Furthermore, a siloxane resin may also be used. The siloxane resin corresponds to a resin including a Si—O—Si bond. Siloxane has a skeleton structure formed of a bond of silicon (Si) and oxygen (O). As a substituent, an organic group containing at least hydrogen (e.g., an alkyl group or aromatic hydrocarbon) can be used. Further, as a substituent, a fluoro group may also be used. Furthermore, as a substituent, an organic group containing at least hydrogen, and a fluoro group may also be used. Still furthermore, an organic insulating material such as polyimide, acrylic, polyamide, polyimide amide, resist, benzocyclobutene, or polysilazane may also be used. A coated film which is formed by a coating method and has favorable planarity may also be used.

The insulating layer 181 can be formed using dipping, spray coating, a doctor knife, a roll coater, a curtain coater, a knife coater, a CVD method, an evaporation method, or the like. The insulating layer 181 may be formed by a droplet discharging method, as well. If a droplet discharging method is used, a material liquid can be saved. Further, a method that enables transferring or drawing a pattern, e.g., a droplet discharging method such as a printing method (a method for forming a pattern such as screen printing or offset printing), can also be used.

Next, using a resist mask, contact holes (openings) that reach the single-crystal semiconductor layer are formed in the insulating layer 181. Etching may be carried out one or more times depending on the selectivity of a material used. The insulating layer 181 is removed by etching to form the openings that reach the second p-type impurity regions 160 and 161, the second n-type impurity region 144 in the reference circuit 209, and the second p-type impurity regions 163a and 163b, and the second n-type impurity regions 147a and 147b which are source and drain regions in the pixel region 206. For the etching, wet etching, dry etching, or the both may be used. As an etchant used in the wet etching, a hydrofluoric-acid-based solution, e.g., a mixed solution containing ammonium hydrogen fluoride and ammonium fluoride, is preferably used. As an etching gas, a chlorine-based gas typified by $Cl_2$, $BCl_3$, $SiCl_4$, $CCl_4$, and the like; a fluorine-based gas typified by $CF_4$, $SF_6$, $NF_3$, and the like; or $O_2$ can be used as appropriate. In addition, an inert gas may be added to the etching gas to be used. As an inert element to be added, one or more kinds of elements selected from He, Ne, Ar, Kr, and Xe can be used.

A conductive film is formed to cover the openings, and the conductive film is etched to form wiring layers 170a, 170b, 170c, 171a, 171b, 172a, and 172b. In the reference circuit 209, the wiring layers 170a, 170b, and 170c are electrically connected to the second p-type impurity regions 160 and 161, and the second n-type impurity region 144, respectively. In the pixel region 206, the wiring layers 171a, 171b, 172a, and 172b are electrically connected to parts of each source region and drain region.

The wiring layers can be formed by forming a conductive film by a PVD method, a CVD method, an evaporation method, or the like and then etching the conductive film into a desired shape. Further, the conductive layers can be selectively formed on given positions by a droplet discharging method, a printing method, an electrolytic plating method, or the like. Furthermore, a reflow method or a damascene method may be used. The source and drain electrode layers may be formed using a metal such as Ag, Au, Cu, Ni, Pt, Pd, Ir, Rh, W, Al, Ta, Mo, Cd, Zn, Fe, Ti, Zr, or Ba; Si, or Ge; or an alloy or nitride thereof. Further, a stacked structure thereof may be used. In this embodiment mode, a titanium (Ti) film, a titanium nitride film, an aluminum film, and a titanium (Ti) film are formed to have thicknesses of 60 nm, 40 nm, 700 nm, and 200 nm, respectively, whereby a stacked structure is formed; and the stacked films are processed into desired shapes.

Through the above steps, an active matrix substrate that has a bipolar transistor 174 in the reference circuit 209, a multi-channel type n-channel transistor 175 having the n-type impurity regions in the Loff regions and a p-channel transistor 176 having the p-type impurity regions in the pixel region 206 can be manufactured (see FIG. 5C).

In the bipolar transistor 174 that is formed in the reference circuit 209, the second p-type impurity region 161 which is a high concentration p-type impurity region in the n-well 110a serves as an emitter and the n-well 110a serves as a base. The single-crystal semiconductor layer 102 having p-type conductivity serves as a collector.

Figure 1B:
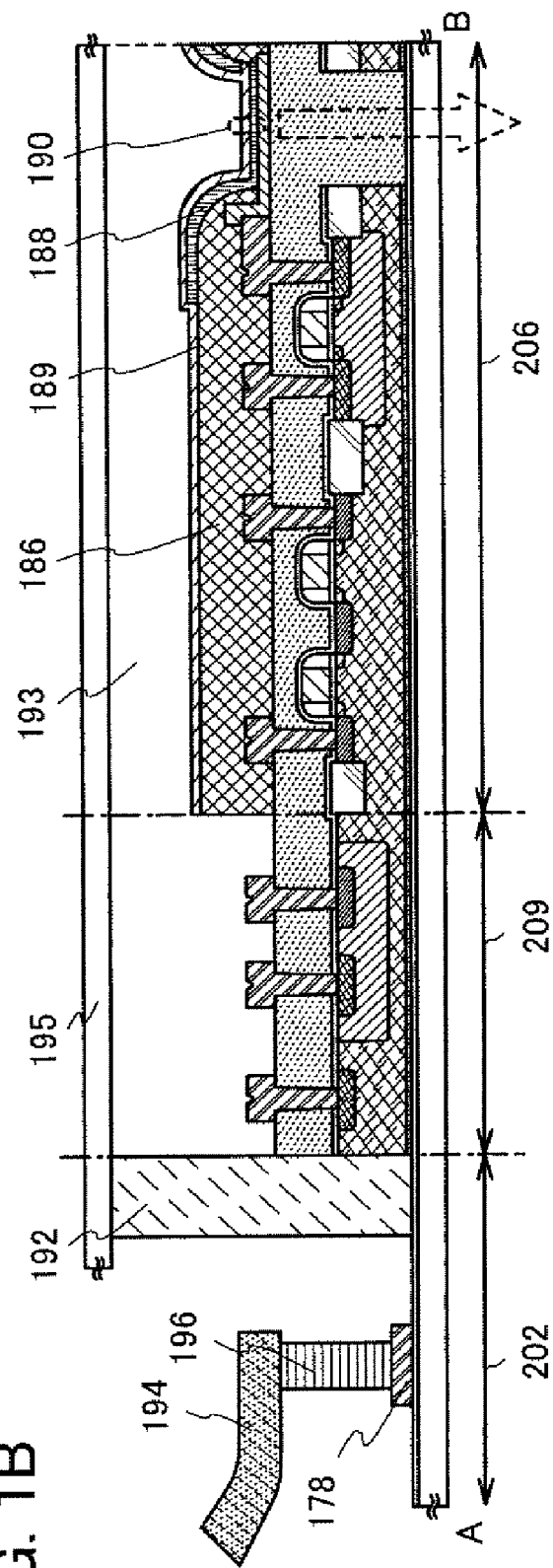
Figure 4A:
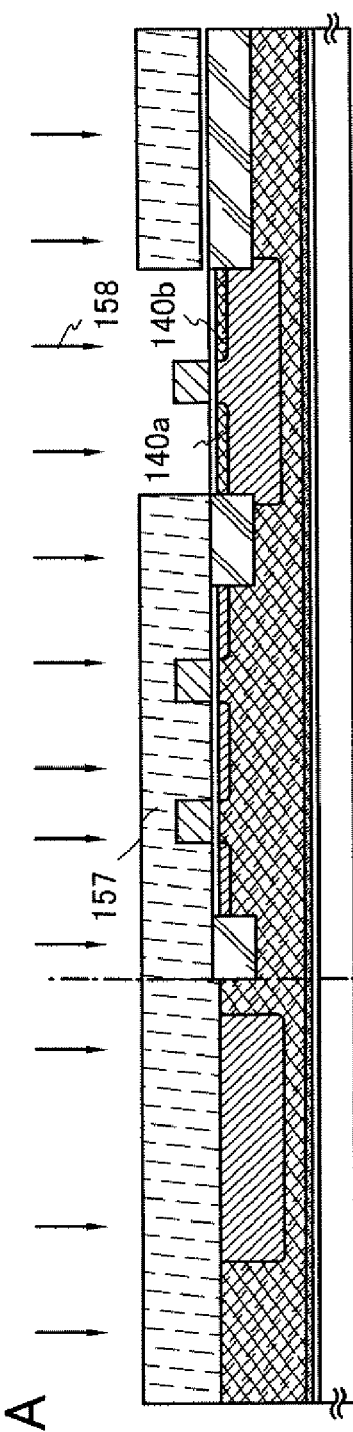
FIGS. 4A to 4C are diagrams illustrating a method for manufacturing a display device of the present invention.
Figure 4B:
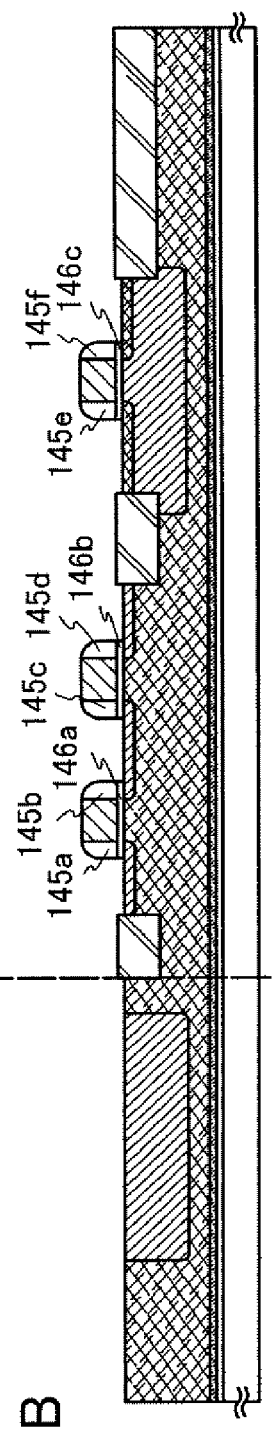
Figure 4C:
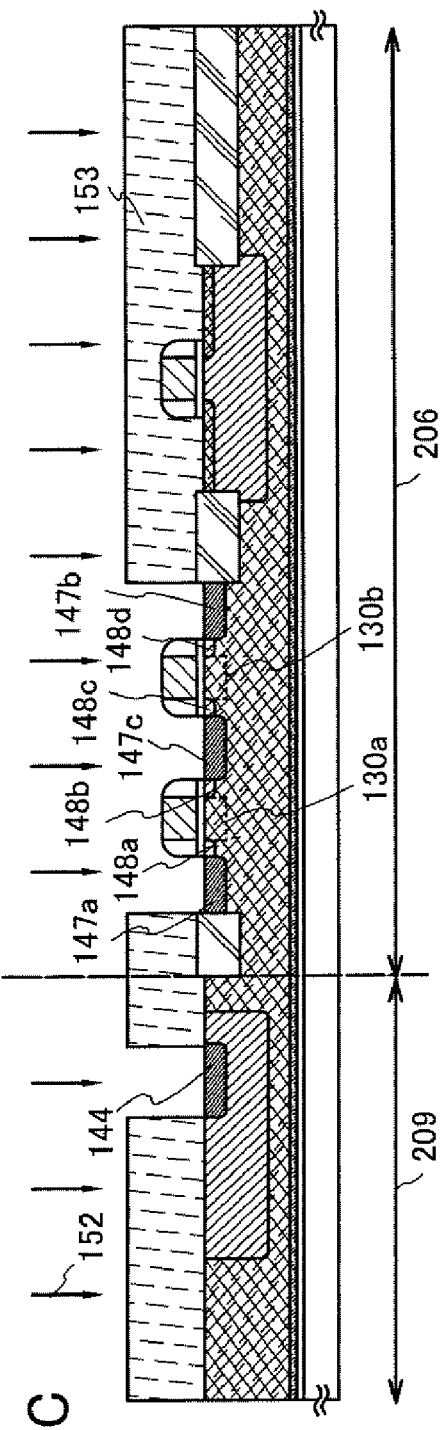

FIGS. 1A and 1B illustrate the display device of this embodiment mode, and show an external terminal connecting region 202, to which an FPC is attached, a driver circuit region 204, the pixel region 206, and the reference circuit 209. A terminal electrode layer 178 to be connected to an external terminal is provided in the external terminal connecting region 202.

Next, a first electrode layer 185 (also referred to as a "pixel electrode layer") is formed so as to be in contact with the source or drain electrode layer. The first electrode layer 185 functions as an anode or a cathode, and may be formed using an element selected from Ti, Ni, W, Cr, Pt, Zn, Sn, In, and Mo; a film which contains an alloy or compound material containing the above element as its main component, such as titanium nitride, $TiSi_xN_y$, $WSi_x$, tungsten nitride, $WSi_xN_y$, or NbN; or stacked films thereof, to have a total thickness in a range of 100 nm to 800 nm.

In this embodiment mode, a light-emitting element is used as a display element. Further, the first electrode layer 185 has a light-transmitting property because light from the light-emitting element is extracted from the first electrode layer 185 side. To form the first electrode layer 185, a transparent conductive film is formed and etched into a desired shape.

In the present invention, the first electrode layer 185 which is a light-transmitting electrode layer may be formed using a transparent conductive film made of a conductive material having a light-transmitting property: indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide to which silicon oxide (ITSO) is added, or the like can also be used.

Further, even if a material such as a metal film which does not have a light-transmitting property is used, light can be emitted through the first electrode layer 185 by forming the layer to be thin (about 5 nm to 30 nm is preferable) so as to transmit light Examples of the thin metal film that can be used for the first electrode layer 185 include a conductive film made of titanium, tungsten, nickel, gold, platinum, silver, aluminum, magnesium, calcium, lithium, or an alloy thereof.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. It is preferable to form the first electrode layer 185 with a total thickness in a range of 100 nm to 800 nm.

The first electrode layer 185 may be wiped or polished by a CMP method or using a polyvinyl-alcohol-based porous body so as to have a flat surface. Further, after the first electrode layer 185 is polished by a CMP method, ultraviolet irradiation, oxygen plasma treatment, or the like may be carried out to the surface of the first electrode layer 185.

After forming the first electrode layer 185, heat treatment may be carried out. Through this heat treatment, moisture contained in the first electrode layer 185 is discharged, so that the first electrode layer 185 is free from degasification or the like. Accordingly, even when a light-emitting material which deteriorates easily due to moisture is used over the first electrode layer 185, the light-emitting material does not deteriorate, and thus a highly reliable display device can be manufactured.

Next, an insulating layer 186 (also referred to as a "partition", a "partition wall", or the like) that covers an end portion of the first electrode layer 185 and the source and drain electrode layers is formed (see FIG. 1A). If the insulating layer 186 is formed using the same material and by the same method as those of the insulating layer 181, manufacturing cost can be reduced. Further, reduction in cost can be achieved when an apparatus such as a coating film forming apparatus or an etching apparatus is used in common.

The insulating layer 186 can be formed using a material selected from silicon oxide, silicon nitride, silicon oxynitride, aluminum oxide, aluminum nitride, aluminum oxynitride which contains more oxygen than nitrogen, aluminum nitride oxide which contains more nitrogen than oxygen, diamond-like carbon (DLC), carbon containing nitrogen, polysilazane, and other substances containing an inorganic insulating material. A material containing siloxane may also be used. Further, an organic insulating material may be used. As the organic material, which may be either photosensitive or nonphotosensitive, polyimide, acrylic, polyamide, polyimide amide, resist, or benzocyclobutene can be used. Furthermore, an oxazole resin, e.g., photo-curable polybenzoxazole, can be used. It is preferable to form the insulating layer 186 so as to have a continuously-changing radius of curvature, and thus coverage with an electroluminescent layer 188 which contains a light-emitting substance and a second electrode layer 189 formed thereover is improved.

In addition, in order to further improve reliability, it is preferable to carry out degasification by vacuum heating before forming the electroluminescent layer 188. For example, before carrying out evaporation of an organic compound material, it is desirable to carry out heat treatment for removing a gas contained in the substrate under a reduced pressure atmosphere or an inert gas atmosphere at 200° C. to 400° C., preferably 250° C. to 350° C. Further, it is preferable to form the electroluminescent layer 188 by a vacuum deposition method or a droplet discharging method under a reduced pressure without exposure to atmospheric air. Through this heat treatment, moisture contained in or attached to the conductive film to be the first electrode layer or the insulating layer (the partition wall) can be discharged. This heat treatment can double as the prior heating step if the substrate can be transferred in a vacuum chamber without breaking the vacuum, and may be carried out for one time after forming the insulating layer (partition wall). Here, by forming the interlayer insulating film and the insulating layer (the partition wall) using a highly heat-resistant substance, a heat treatment step for improving the reliability can be sufficiently carried out.

Over the first electrode layer 185, the electroluminescent layer 188 is formed. Although only one pixel is shown in FIG. 1B, electroluminescent layers corresponding to each color, R (red), G (green) and B (blue), are separately formed in this embodiment mode. The electroluminescent layer 188 may be formed as follows: by mixing an organic compound and an inorganic compound, a layer having a function of a high carrier injecting property and a high carrier transporting property, which cannot be obtained when only one of an organic compound and an inorganic compound is used, is provided over the first electrode layer 185.

Materials (a low-molecular material, a high-molecular material, or the like) which exhibit light-emission of red (R), green (G), and blue (B) can also be formed by a droplet discharging method.

Next, the second electrode layer 189 formed of a conductive film is provided over the electroluminescent layer 188. For the second electrode layer 189, a material having a low work function (e.g., Al, Ag, Li, Ca, or an alloy containing these metals, such as MgAg, MgIn, AlLi, $CaF_2$, or calcium nitride) may be used. In this manner, a light-emitting element 190 including the first electrode layer 185, the electroluminescent layer 188, and the second electrode layer 189 is formed.

In the display device of this embodiment mode shown in FIGS. 1A and 1B, since the single-crystal semiconductor layer in a region through which light from the light-emitting element 190 is transmitted is removed, light from the light-emitting element 190 is emitted through the first electrode layer 185 side by being transmitted in a direction of an arrow in FIG. 1B.

It is effective to provide a passivation film so as to cover the second electrode layer 189. The passivation film is formed of an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) which contains more nitrogen than oxygen, aluminum oxide, diamond-like carbon (DLC), or carbon containing nitrogen (CN). Further, the passivation film can be either a single layer or stacked layers of the insulating films. Furthermore, a siloxane resin may also be used.

As the passivation film, it is preferable to use a film with favorable coverage. For example, a carbon film, in particular, a DLC film is effective. Because a DLC film can be formed at temperatures ranging from the room temperature to 100° C., it can be easily formed even above the electroluminescent layer 188 having low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam evaporation method, a laser evaporation method, or the like. As a reactive gas used for forming the film, a hydrogen gas and a hydrocarbon-based gas (e.g., $CH_4$, $C_2H_2$, or $C_6H_6$) are used, and the reactive gas is ionized by glow discharge, and the ions are accelerated to collide with a negatively self-biased cathode, so that the film can be formed. In a case of forming a CN film, a $C_2H_4$ gas and a $N_2$ gas may be used as reactive gases. A DLC film has a high blocking effect against oxygen and can suppress oxidation of the electroluminescent layer 188. Therefore, the DLC film can prevent a problem that the electroluminescent layer 188 might be oxidized during a subsequent sealing step.

The supporting substrate 100 over which the light-emitting element 190 is formed in the above manner and a sealing substrate 195 are bonded together using a sealant 192, thereby sealing the light-emitting element (see FIG. 1B). In the display device of the present invention, the sealant 192 and the insulating layer 186 are formed apart so as not to contact with each other. By forming the sealant and the insulating layer 186 apart from each other, even when an insulating material which contains a highly hygroscopic organic material is used for the insulating layer 186, moisture does not easily enter and deterioration of the light-emitting element is prevented, thereby improving the reliability of the display device. As the sealant 192, typically, it is preferable to use a visible-light-curable resin, an ultraviolet-ray-curable resin, or a thermosetting resin. For example, an epoxy resin such as a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis epoxy resin, a glycidyl ester resin, a glycidyl-amine-based resin, a heterocyclic epoxy resin, or a modified epoxy resin can be used. A region surrounded by the sealant may be filled with a filler 193, or with nitrogen or the like by sealing under a nitrogen atmosphere. Since a bottom emission type is employed in this embodiment mode, the filler 193 is not required to transmit light. However, in a case of extracting light through the filler 193, the filler 193 is required to transmit light. Typically, a visible-light curable, ultraviolet-ray curable, or thermosetting epoxy resin may be used. Through the aforementioned steps, a display device having a display function using a light-emitting element of this embodiment mode is completed. Further, the filler may be dripped in a liquid state to fill the display device.

A drying agent is provided in an EL display panel in order to prevent deterioration of the element due to moisture. In this embodiment mode, a drying agent is provided on the sealing substrate 195 side so as not to block the light emitted from the light-emitting element.

Although this embodiment mode illustrates a case where the light-emitting element is sealed with a glass substrate, any of the following sealing treatment, which can protect the light-emitting element against moisture, can be used: a mechanical sealing method with a covering material, a sealing method with a thermosetting resin or an ultraviolet-ray-curable resin, or a sealing method with a thin film having a high barrier property such as metal oxide or metal nitride. As the covering material, glass, ceramics, plastics, or metal can be used. If light is to be emitted through the covering material, the covering material is required to transmit light. Further, the covering material and the substrate over which the light-emitting element is formed are bonded together with a sealant such as a thermosetting resin or an ultraviolet-ray-curable resin, and the resin is hardened through heat treatment or ultraviolet irradiation, so that an enclosed space is formed. It is also effective to provide a hygroscopic material typified by barium oxide in the enclosed space. This hygroscopic material may be provided on the sealant, or above the partition wall or in the peripheral portion so as not to block light emitted from the light-emitting element. Further, a space between the covering material and the substrate over which the light-emitting element is formed can also be filled with a thermosetting resin or an ultraviolet-ray-curable resin. In this case, it is effective to add a hygroscopic material typified by barium oxide into the thermosetting resin or the ultraviolet-ray-curable resin.

Although in the display device of this embodiment mode shown in FIGS. 1A and 1B, the wiring layer 172*b* and the first electrode layer 185 are in direct contact with each other to have an electrical connection, the source or drain electrode layer and the first electrode layer may be electrically connected to each other through another wiring layer. Furthermore, although in FIGS. 1A and 1B, the first electrode layer 185 is formed partially over the wiring layer 172*b*, such a structure may also be employed: the first electrode layer 185 is formed, and then the wiring layer 172*b* is formed thereover so as to be in contact with the first electrode layer 185.

In this embodiment mode, in the external terminal connecting region 202, an FPC 194 is connected to the terminal electrode layer 178 through an anisotropic conductive layer 196, whereby electrical connection to the outside is obtained. Further, as shown in FIG. 1A, which is a top view of the display device, the display device manufactured in this embodiment mode is provided with a driver circuit region 208 having a scan line driver circuit, in addition to the driver circuit region 204 having a signal line driver circuit.

Although the display device of this embodiment mode is constructed of the circuits as described above, the present invention is not limited thereto. For example, IC chips may be mounted as the driver circuits by a COG method or a TAB method as described above. Further, the number of the gate line driver circuit and source line driver circuit can be either one or plural.

Furthermore, the driving method for image display of the display device of the present invention is not particularly limited. For example, a dot sequential driving method, a line sequential driving method, a frame sequential driving method, or the like can be used. Typically, a line sequential driving method can be used, and a time division gray scale driving method or an area gray scale driving method may be combined as appropriate. In addition, video signals to be input into source lines of the display device may be either analog signals or digital signals, and driver circuits and the like may be designed, as appropriate, in accordance with the video signals.

Further, in a display device using a digital video signal, a video signal which is input into a pixel has a constant voltage (CV) or a constant current (CC). With regard to a video signal with a constant voltage (CV), a voltage which is applied to a light-emitting element is constant (CVCV), or current which flows through a light-emitting element is constant (CVCC). Further, with regard to a video signal with a constant current (CC), a voltage which is applied to a light-emitting element is constant (CCCV), or current which flows through a light-emitting element is constant (CCCC).

As described above, the reference circuit 209 having the bipolar transistor 174 can be provided over the same substrate as the pixel region 206.

Figure 9A:
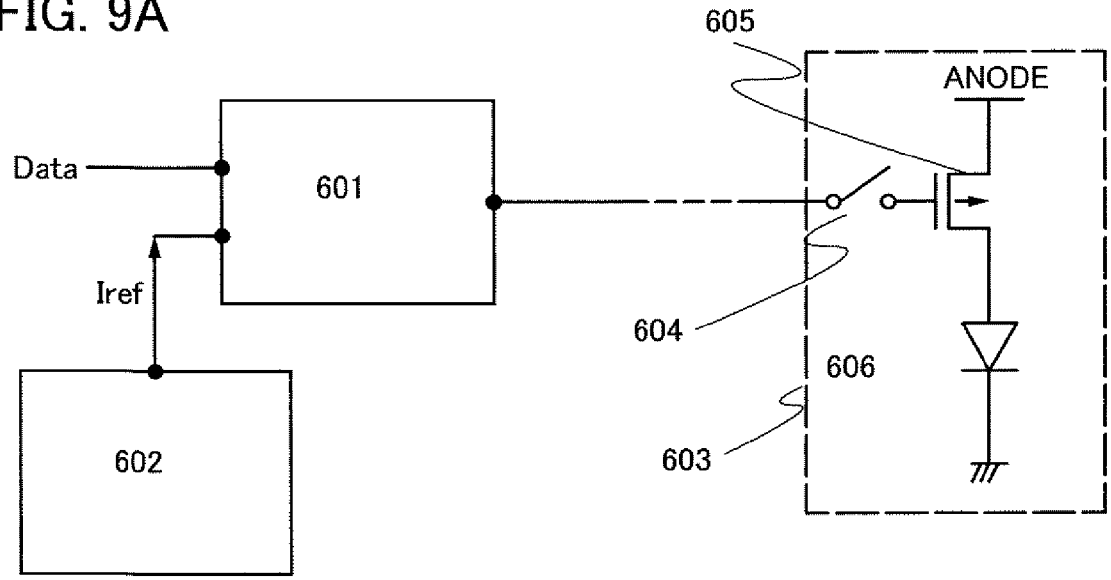
FIG. 9A is a block diagram of a display device of the present invention.
Figure 9B:
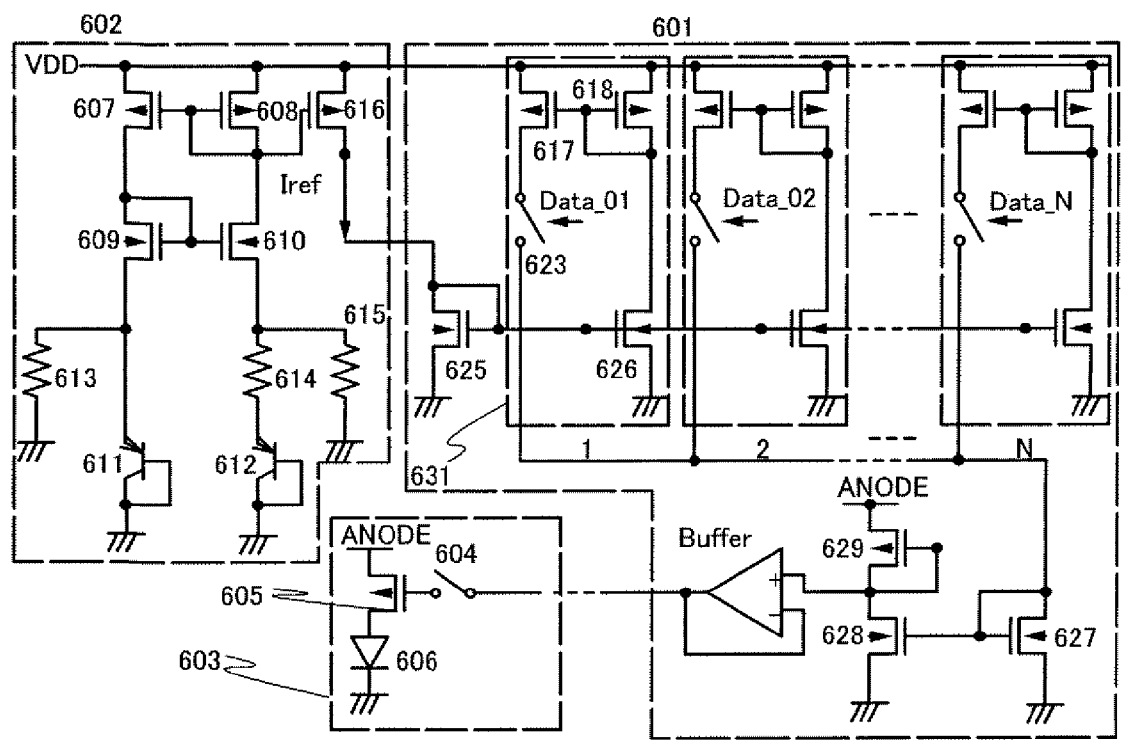
FIG. 9B is a circuit diagram thereof.

An example of a display device described in this embodiment mode is described using a block diagram shown in FIG. 9A and a circuit diagram shown in FIG. 9B. FIG. 9A is a block diagram of the display device. A digital video signal from the outside and a reference current Iref output from a reference circuit 602 are input into a D-A converter 601. The D-A converter 601 outputs an analog voltage. The analog voltage is applied to a gate of a driving transistor 605 through a switch 604 of a pixel 603.

In FIG. 9B, each circuit is specifically described. The reference circuit 602 is formed of PNP bipolar transistors 611 and 612, p-channel transistors 607, 608, and 616, n-channel transistors 609 and 610, and resistors 613, 614, and 615. The p-channel transistors 607 and 608 which make a pair and the n-channel transistors 609 and 610 which make a pair each have the same current characteristics and the same size and are operated in a saturation region. The resistance values of the resistors 613, 614, and 615 and the sizes of the PNP bipolar transistors 611 and 612 are selected as appropriate so that a constant current without depending on temperature can be generated. The p-channel transistor 616 outputs current per one pixel that is needed to express one gradation level by EL display using a light-emitting element (an EL element) as a ratio of size (size of a channel width of a semiconductor layer) of the p-channel transistor 616 to that of the p-channel transistors 607 and 608 as the reference current Iref.

In the D-A converter 601, one unit 631 is formed of p-channel transistors 617 and 618, an n-channel transistor 626, and a switch 623. The p-channel transistors 617 and 618 have the same current characteristic and the same size as those of the driving transistor 605 of a light-emitting element 606 of the pixel 603 and are operated in a saturation region. The reference current Iref which is output from the reference circuit 602 is input into an n-channel transistor 625, and the n-channel transistor 625 is operated in a saturation region. The n-channel transistor 626 also has the same current characteristic and the same size as those of the n-channel transistor 625 and is operated in a saturation region. Whether current of the p-channel transistor 617 flows to a p-channel transistor 629 is determined by turning on and off of the switch 623 using a digital video signal.

The N number of units 631 is similarly arranged in the D-A converter 601.

N-channel transistors 627 and 628 also have the same current characteristic and the size and are operated in a saturation region. A gate terminal and a drain terminal of the p-channel transistor 629 are connected to each other. The p-channel transistor 629 has the same current characteristic and the same size as those of the driving transistor 605 of a light-emitting element 606 of a pixel 603 and is operated in a saturation region. The input of a buffer 630 is connected to the gate and the drain terminal of the p-channel transistor 629, and a voltage between the gate and the drain terminal is applied to the gate of the driving transistor 605 through the switch 604 of the pixel 603.

If the above structure is used, desired current without depending on temperature can be passed through the light-emitting element.

A single-crystal semiconductor layer which is transposed from the single-crystal semiconductor substrate is used for the semiconductor layer of transistors of the reference circuit 209 and the pixel region 206, and it is preferable that the thickness of the single-crystal semiconductor layer be greater than or equal to 1 μm and less than or equal to 3 μm. If the above film thickness is used, when a CMOS is formed in the pixel region and the reference circuit, the reference circuit provided with a bipolar transistor (also referred to as a parasitic bipolar transistor because it can be formed in the same process) which can be formed in the reference circuit in the same process can be used as a reference circuit which compensates temperature dependence of the driving transistor that is driven by supply of current to the light-emitting element of the pixel. Since a reference current generation circuit using the bipolar transistor has very small temperature dependence, the reference current generation circuit has an effect as a reference circuit used to make the drive current of the driving transistor constant, without depending on temperature.

As described above, the display device of this embodiment mode can be provided with a transistor having a uniform property by using a single-crystal semiconductor layer which is separated from a single-crystal semiconductor substrate, attached and provided over a supporting substrate.

Further, by provision of the reference circuit having a bipolar transistor, temperature dependence of a driving transistor that is driven by supplying current to a light-emitting element of a pixel can be compensated.

Accordingly, a display device which prevents display unevenness and decrease in image quality and has high image quality and high reliability can be provided.

Embodiment Mode 2

A display device having a light-emitting element can be formed by applying the present invention. Light is emitted from the light-emitting element by any of bottom emission, top emission, and dual emission. In this embodiment mode, an example of a dual emission display device which is for achieving high reliability and has a high-quality display function with excellent visibility will be described with reference to FIG. 8.

Figure 8:
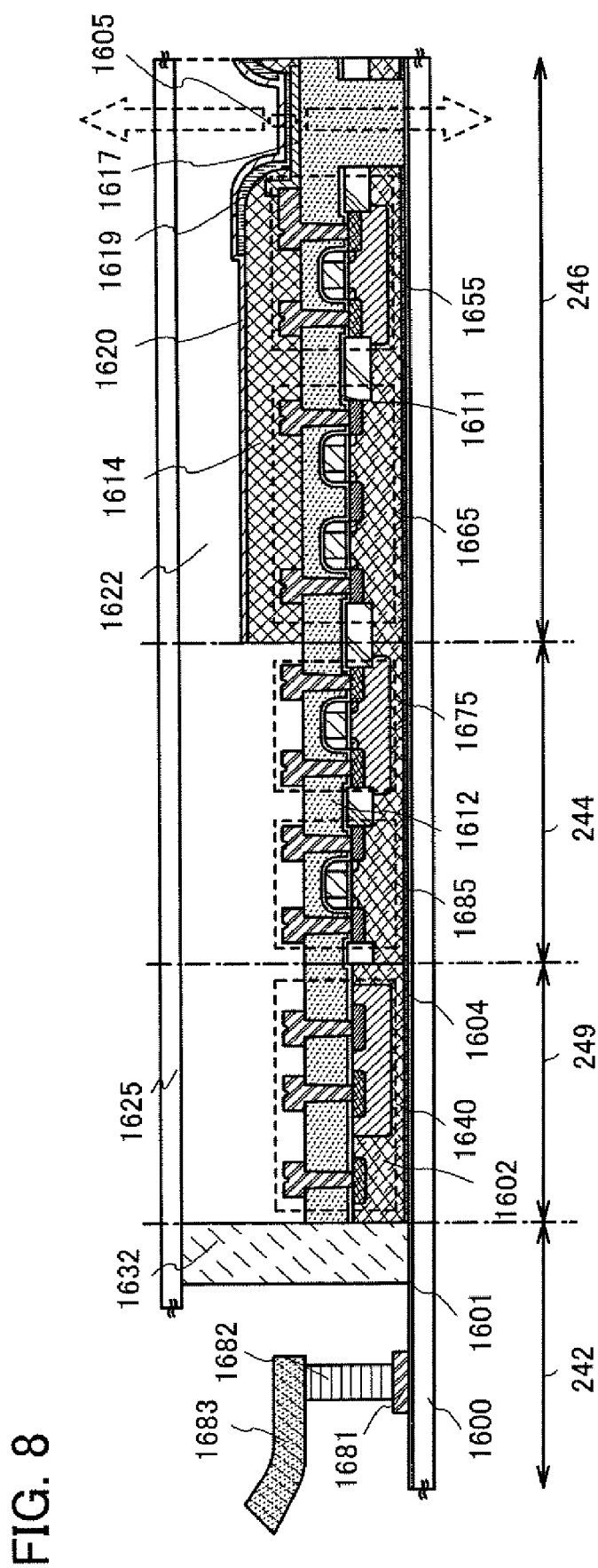
FIG. 8 is a diagram illustrating a circuit structure of a display device of the present invention.

A display device shown in FIG. 8 includes a light-transmitting element substrate 1600 having an insulating surface, a blocking layer 1601, an insulating layer 1604 having a bonding surface, a single-crystal semiconductor layer 1602, transistors 1655, 1665, 1675, and 1685, a bipolar transistor 1640, a first electrode layer 1617, an electroluminescent layer 1619, a second electrode layer 1620, a filler 1622, a sealant 1632, insulating films 1611 and 1612, an insulating layer 1614, a sealing substrate 1625, a terminal electrode layer 1681, an anisotropic conductive layer 1682, and an FPC 1683. The display device has an external terminal connecting region 242, a reference circuit 249, a driver circuit region 244, and a pixel region 246. The filler 1622 is in a state of a liquid composition and can be formed by a dripping method. The element substrate 1600 over which the filler is formed by a dripping method and the sealing substrate 1625 are attached to each other, and thus, a light-emitting display device is sealed.

The display device of FIG. 8 is a dual emission type, in which light is emitted from both the element substrate 1600 side and the sealing substrate 1625 side in directions indicated by arrows. Therefore, a light-transmitting electrode layer is used for each of the first electrode layer 1617 and the second electrode layer 1620.

In this embodiment mode, the first electrode layer 1617 and the second electrode layer 1620 that are light-transmitting electrode layers may be formed, specifically, using a transparent conductive film formed of a light-transmitting conductive material: for example, indium oxide containing tungsten oxide, indium zinc oxide containing tungsten oxide, indium oxide containing titanium oxide, or indium tin oxide containing titanium oxide can be used. It is needless to say that indium tin oxide (ITO), indium zinc oxide (IZO), indium tin oxide to which silicon oxide is added (ITSO), or the like can also be used.

Further, even if a material such as a metal which does not have a light-transmitting property is used, light can be emitted through the first electrode layer 1617 and the second electrode layer 1620 by forming the layer to be thin (about 5 nm to 30 nm is preferable) so as to transmit light. Examples of the thin metal film that can be used for the first electrode layer 1617 and the second electrode layer 1620 include a conductive film made of titanium, tungsten, nickel, gold, platinum, silver, aluminum, magnesium, calcium, lithium, or an alloy thereof.

As described above, in the display device of FIG. 8, light emitted from a light-emitting element 1605 passes through both the first electrode layer 1617 and the second electrode layer 1620, whereby light is emitted from both sides.

A pixel of a display device that is formed using a light-emitting element can be driven by a passive matrix mode or an active matrix mode. In addition, either digital driving or analog driving can be employed.

A color filter (colored layer) may be provided for the sealing substrate. The color filter (colored layer) can be formed by an evaporation method or a droplet discharging method. With the use of the color filter (colored layer), high-definition display can be performed. This is because a broad peak can be modified to be sharp in the light emission spectrum of each of R, Q and B by the color filter (colored layer).

Full color display can be performed by formation of a material to emit light of a single color and combination of the material with a color filter or a color conversion layer. The color filter (colored layer) or the color conversion layer may be provided for, for example, the sealing substrate, and the sealing substrate may be attached to the element substrate.

It is needless to say that display of single color light emission may also be performed. For example, an area color type display device may be formed by using single color light emission. The area color type is suitable for a passive matrix display portion and can mainly display characters and symbols.

The transistors provided in the display devices of this embodiment mode shown in FIG. 8 can be formed similarly to the transistors described in Embodiment Mode 1. The driver circuit region 204 in Embodiment Mode 1 corresponds to the driver circuit region 244 in FIG. 8 in this embodiment mode. The pixel region 206 in Embodiment Mode 1 corresponds to the pixel region 246 in FIG. 8 in this embodiment mode. The reference circuit 209 in Embodiment Mode 1 corresponds to the reference circuit 249 in FIG. 8 in this embodiment mode. However, this embodiment mode is not limited thereto, and a transistor that contains silicide or a transistor that does not have a sidewall structure can be applied to forming a display device having a light-emitting element. When a structure that contains silicide is used, resistance of the source region and the drain region can be lowered and the speed of the display device is increased. Since operation is possible with a low voltage, power consumption can be reduced.

With the use of a single-crystal semiconductor layer, a pixel region and a driver circuit region can be formed over the same substrate. In that case, transistors in the pixel region and transistors in the driver circuit region are formed at the same time.

Therefore, the display device of the present invention can be used as a display device which has high image quality and high reliability.

This embodiment mode can be combined with Embodiment Mode 1 as appropriate.

Embodiment Mode 3

This embodiment mode will describe an example of a display device for achieving high image quality and high reliability. Specifically, a light-emitting display device using a light-emitting element for a display element will be described.

In this embodiment mode, structures of light-emitting elements that can be used for display elements in the display device of the present invention will be described with reference to FIGS. 13A and 13B.

Figure 13A:
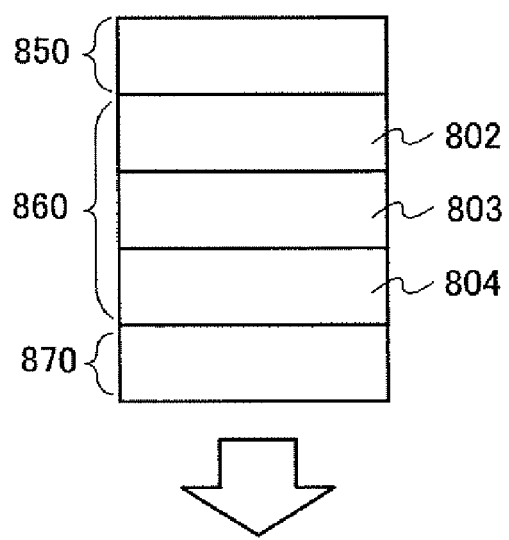
FIGS. 13A and 13B are diagrams illustrating a structure of a light-emitting element applicable to the present invention.
Figure 13B:
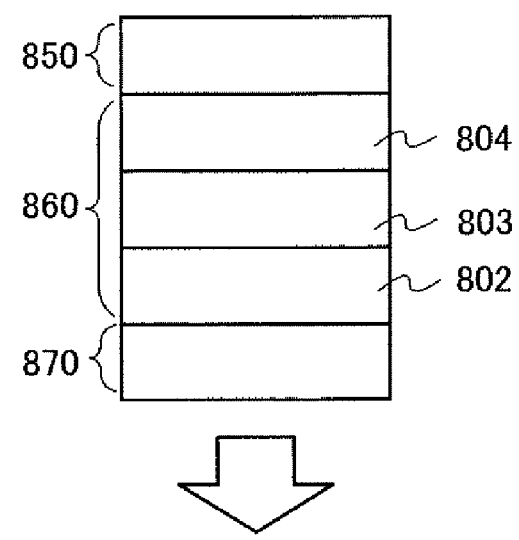

FIGS. 13A and 13B illustrate structures of a light-emitting element in which an EL layer 860 is sandwiched between a first electrode layer 870 and a second electrode layer 850. The EL layer 860 includes a first layer 804, a second layer 803, and a third layer 802 as shown in the drawings. In FIGS. 13A and 13B, the second layer 803 is a light-emitting layer, and the first layer 804 and the third layer 802 are functional layers.

The first layer 804 is a layer having a function of transporting holes to the second layer 803. In FIGS. 13A and 13B, a hole-injecting layer included in the first layer 804 includes a substance having a high hole-injecting property, and molybdenum oxide, vanadium oxide, ruthenium oxide, tungsten oxide, manganese oxide, or the like can be used. Further, the following can also be used: a phthalocyanine-based compound such as phthalocyanine (abbrev.: $H_2Pc$) or copper phthalocyanine (abbrev.: CuPc); an aromatic amine compound such as 4,4'-bis[N-(4-diphenylaminophenyl)-N-phenylamino]biphenyl (abbrev.: DPAB) or 4,4'-bis(N-{4-[N-(3-methylphenyl)-N-phenylamino]phenyl}-N-phenylamino)biphenyl (abbrev.: DNTPD); a high molecule such as poly(ethylenedioxythiophene)/poly(styrenesulfonic acid) (abbrev.: PEDOT/PSS); and the like.

Further, a composite material including an organic compound and an inorganic compound can be used as the hole-injecting layer. In particular, a composite material including an organic compound and an inorganic compound showing an electron-accepting property with respect to the organic compound is excellent in hole-injecting property and hole-transporting property since electrons are transferred between the organic compound and the inorganic compound and carrier density is increased.

Further, in the case where a composite material including an organic compound and an inorganic compound is used as the hole-injecting layer, the hole-injecting layer can form an ohmic contact with the electrode layer; therefore, a material of the electrode layer can be selected regardless of work function.

As the inorganic compound used for the composite material, oxide of a transition metal is preferably used. In addition, oxide of a metal in Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used for the composite material, various compounds can be used, such as an aromatic amine compound, a carbazole derivative, aromatic amine hydrocarbon, or a high molecular compound (e.g., an oligomer, a dendrimer, or a polymer). Note that, as the organic compound used for the composite material, it is preferable to use an organic compound having a high hole-transporting property. Specifically, it is preferable to use a substance having a hole mobility of $10^{-6}$ cm$^2$/Vs or more. Further, other materials may also be used as long as a hole-transporting property thereof is higher than an electron-transporting property. Examples of the organic compound which can be used for the composite material are specifically listed below.

For example, as examples of the aromatic amine compound, the following can be given: N,N'-di(p-tolyl)-N,N'-diphenyl-p-phenylenediamine (abbrev.: DTDPPA); 4,4'-bis[N-(4-diphenylaminophenyl)-N-phenylamino]biphenyl (abbrev.: DPAB); 4,4'-bis(N-{4-[N-(3-methylphenyl)-N-phenylamino]phenyl}-N-phenylamino)biphenyl (abbrev.: DNTPD); 1,3,5-tris[N-(4-diphenylaminophenyl)-N-phenylamino]benzene (abbrev.: DPA3B); and the like.

As examples of the carbazole derivative which can be used for the composite material, the following can be given: 3-[N-(9-phenylcarbazol-3-yl)-N-phenylamino]-9-phenylcarbazole (abbrev.: PCzPCA1); 3,6-bis[N-(9-phenylcarbazol-3-yl)-N-phenylamino]-9-phenylcarbazole (abbrev.: PCzPCA2); 3-[N-(1-naphthyl)-N-(9-phenylcarbazol-3-yl)amino]-9-phenylcarbazole (abbrev.: PCzPCN1); and the like.

Further, the following can also be used: 4,4'-di(N-carbazolyl)biphenyl (abbrev.: CBP); 1,3,5-tris[4-(N-carbazolylphenyl]benzene (abbrev.: TCPB); 9-[4-(N-carbazolyl)]phenyl-10-phenylanthracene (abbrev.: CzPA); 1,4-bis[4-(N-carbazolyl)phenyl]-2,3,5,6-tetraphenylbenzene; and the like.

Further, as examples of the aromatic hydrocarbon which can be used for the composite material, the following can be given: 2-tert-butyl-9,10-di(2-naphthyl)anthracene (abbrev.: t-BuDNA); 2-tert-butyl-9,10-di(1-naphthyl)anthracene; 9,10-bis(3,5-diphenylphenyl)anthracene (abbrev.: DPPA); 2-tert-butyl-9,10-bis(4-phenylphenyl)anthracene (abbrev.: t-BuDBA); 9,10-di(2-naphthyl)anthracene (abbrev.: DNA); 9,10-diphenylanthracene (abbrev.: DPAnth); 2-tert-butylanthracene (abbrev.: t-BuAnth); 9,10-bis(4-methyl-1-naphthyl)

anthracene (abbrev.: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, an aromatic hydrocarbon which has a hole mobility of $1 \times 10^{-6}$ cm$^2$/Vs or more and of which the carbon number is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10-bis[4-(2,2-diphenylvinyl)phenyl]anthracene (abbrev.: DPVPA), and the like can be given.

Further, a high molecular compound such as poly(N-vinylcarbazole) (abbrev.: PVK) or poly(4-vinyltriphenylamine) (abbrev.: PVTPA) can also be used.

As a substance for forming a hole-transporting layer included in the first layer 804 in FIGS. 13A and 13B, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-naphthyl)-N-phenylamino]biphenyl (hereinafter referred to as NPB); and a starburst aromatic amine compound such as 4,4',4"-tris(N,N-diphenyl-amino)triphenylamine and 4,4',4"-tris[N-(3-methylphenyl)-N-phenylamino]triphenylamine. These substances described here are mainly substances each having a hole mobility of $10^{-6}$ cm$^2$/Vs or more. Further, other materials may also be used as long as a hole-transporting property thereof is higher than an electron-transporting property. The hole-transporting layer is not limited to a single layer and may be a mixed layer of any of the aforementioned substances or a stacked layer which includes two or more layers each containing the aforementioned substance.

The third layer 802 has a function of transporting and injecting electrons to the second layer 803. With reference to FIGS. 13A and 13B, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), or bis(2-methyl-8-quinolinolato)(4-phenylphenolato)aluminum (abbrev. BAlq) can be used. Further, a metal complex or the like including an oxazole-based or thiazole-based ligand, such as bis[2-(2-hydroxyphenyl)benzoxazolato]zinc (abbrev.: Zn(BOX)$_2$) or bis[2-(2-hydroxyphenyl)benzothiazolato]zinc (abbrev.: Zn(BTZ)$_2$) can be used. Besides the above metal complexes, the following can be used: 2-(4-biphenylyl)-5-(4-tert-butylphenyl)-1,3,4-oxadiazole (abbrev.: PBD); 1,3-bis[5-(p-tert-butylphenyl)-1,3,4-oxadiazol-2-yl]benzene (abbrev.: OXD-7); 3-(4-biphenylyl)-4-phenyl-5-(4-tert-butylphenyl)-1,2,4-triazole (abbrev.: TAZ), bathophenanthroline (abbrev.: BPhen); bathocuproine (abbrev.: BCP); and the like. These substances described here are mainly substances each having an electron mobility of $10^{-6}$ cm$^2$/Vs or more. Further, other substances may also be used as the electron transporting layer as long as an electron transporting property thereof is higher than a hole transporting property. The electron transporting layer is not limited to a single layer and may be a stacked layer which includes two or more layers each containing the aforementioned substance.

With reference to FIGS. 13A and 13B, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-transporting property and contains an alkali metal, an alkaline earth metal, or a compound thereof (e.g., a layer of Alq containing magnesium (Mg)) or the like can be used. It is preferable to use the layer which is made of a substance having an electron-transporting property and contains an alkali metal or an alkaline earth metal as the electron-injecting layer since electron injection from the electrode layer is efficiently performed.

Then, the second layer 803 which is a light-emitting layer is described. The light-emitting layer has a function of emitting light and includes an organic compound having a light-emitting property. Further, the light-emitting layer may include an inorganic compound. The light-emitting layer may be formed using various light-emitting organic compounds and inorganic compounds. The thickness of the light-emitting layer is preferably about 10 nm to 100 nm.

There are no particular limitations on the organic compound used for the light-emitting layer as long as it is a light-emitting organic compound. The organic compounds include, for example, 9,10-di(2-naphthyl)anthracene (abbrev.: DNA), 9,10-di(2-naphthyl)-2-tert-butylanthracene (abbrev.: t-BuDNA), 4,4'-bis(2,2-diphenylvinyl)biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-6-[p-(dimethylamino)styryl]-4H-pyran (abbrev.: DCM1), 4-(dicyanomethylene)-2-methyl-6-[2-(julolidin-9-yl)ethenyl]-4H-pyran (abbrev.: DCM2), and 4-(dicyanomethylene)-2,6-bis[p-(dimethylamino)styryl]-4H-pyran (abbrev.: BisDCM). Further, a compound capable of emitting phosphorescence such as bis[2-(4',6'-difluorophenyl)pyridinato-N,C$^{2'}$]iridium(picolinate) (abbrev.: FIrpic), bis{2-[3',5'-bis(trifluoromethyl)phenyl]pyridinato-N,C$^{2'}$}iridium(picolinate) (abbrev.: Ir(CF$_3$ppy)$_2$(pic)), tris(2-phenylpyridinato-N,C$^{2'}$)iridium (abbrev.: Ir(ppy)$_3$), bis(2-phenylpyridinato-N,C$^{2'}$)iridium(acetylacetonate) (abbrev.: Ir(ppy)$_2$(acac)), bis[2-(2'-thienyl)pyridinato-N,C$^{3'}$]iridium (acetylacetonate) (abbrev.: Ir(thp)$_2$(acac)), bis(2-phenylquinolinato-N,C$^{2'}$)iridium(acetylacetonate) (abbrev.: Ir(pq)$_2$(acac)), or bis[2-(2'-benzothienyl)pyridinato-N,C$^{3'}$]iridium(acetylacetonate) (abbrev.: Ir(btp)$_2$(acac)) may be used.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, only a small amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element to emit light of green that has high visibility for human eyes with the use of a triplet excitation light-emitting material.

The light-emitting layer may be formed of not only the organic compound described above, which emits light, but another organic compound may also be added thereto. Examples of the organic compound that can be added include TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi, which are mentioned above, and 4,4'-bis(N-carbazolyl)biphenyl (abbrev.: CBP), and 1,3,5-tris[4-(N-carbazolyl)phenyl]benzene (abbrev.: TCPB). However, the present invention is not limited thereto. It is preferable that the organic compound which is added have larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, a light-emitting layer corresponding to each of R (red), G (green), and B (blue) is formed. Also in this case, color purity can be improved and a pixel region can be prevented from having a mirror surface (reflecting) by provision of a filter which transmits light of the emission wavelength range on the light-emission side of the pixel. By provision of the filter, a circularly polarizing plate or the like that has been considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer A high-molecular organic light-emitting material has higher physical strength and an element using the high-molecular organic light-emitting material has higher durability than an element using a low-molecular material. In addition, since a high-molecular organic light-emitting material can be formed by coating, the element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As the polyparaphenylene-based material, a derivative of polyparaphenylene [PPP] such as poly(2,5-dialkoxy-1,4-phenylene) [RO-PPP] or poly(2,5-dihexoxy-1,4-phenylene) can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly (3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2, 2bithiophene] [PTOPT] can be given. As the polyfluorene-based material, a derivative of polyfluorene [PF] such as poly(9,9-dialkylfluorene) [PDAF] or poly(9,9-dioctylfluorene) [PDOF] can be given.

The inorganic compound used for the light-emitting layer may be any inorganic compound as long as light emission of the organic compound is not easily quenched by the inorganic compound, and various kinds of metal oxide and metal nitride may be used. In particular, metal oxide having a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being forwardly biased. A pixel of a display device which is formed using a light-emitting element can be driven by a passive matrix mode or an active matrix mode. In any case, each pixel emits light by application of forward bias thereto at a specific timing; however, the pixel is in a non-light-emitting state for a certain period. Reliability of a light-emitting element can be improved by application of reverse bias in the non-light-emitting time. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias is applied forwardly and reversely; thus, reliability of a light-emitting display device can be improved. In addition, either digital driving or analog driving can be applied.

A color filter (colored layer) may be provided for a sealing substrate. The color filter (colored layer) can be formed by an evaporation method or a droplet discharging method. High-definition display can be performed with the use of the color filter (colored layer). This is because a broad peak can be modified to be sharp in a light emission spectrum of each of R, G, and B by the color filter (colored layer).

Full color display can be performed by formation of a material emitting light of a single color and combination of the material with a color filter or a color conversion layer. The color filter (colored layer) or the color conversion layer may be provided for, for example, the sealing substrate, and the sealing substrate may be attached to the element substrate.

It is needless to say that display of single color light emission may also be performed. For example, an area color type display device may be formed by using single color light emission. The area color type is suitable for a passive matrix display portion, and can mainly display characters and symbols.

Materials for the first electrode layer 870 and the second electrode layer 850 are necessary to be selected considering the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode, as shown in FIG. 13A. In the case where the polarity of the driving thin film transistor is an n-channel type, the first electrode layer 870 may serve as a cathode and the second electrode layer 850 may serve as an anode, as shown in FIG. 13B. Materials that can be used for the first electrode layer 870 and the second electrode layer 850 are described below. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is excellent in a hole-injecting property and a hole-transporting property and the third layer 802 is excellent in an electron-injecting property and an electron transporting property, both the first electrode layer 870 and the second electrode layer 850 are scarcely restricted by a work function and various materials can be used.

The light-emitting elements in FIGS. 13A and 13B each have a structure in which light is extracted from the first electrode layer 870 and thus, the second electrode layer 850 is not necessary to have a light-transmitting property. The second electrode layer 850 may be formed of a film mainly containing an element selected from Ti, Ni, W, Cr, Pt, Zn, Sn, In, Ta, Al, Cu, Au, Ag, Mg, Ca, Li and Mo, or an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 nm to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have variations by changing yes of the first electrode layer 870 and the second electrode layer 850.

FIG. 13B shows the case where the EL layer 860 is formed by stacking the third layer 802, the second layer 803, and the first layer 804 in this order from the first electrode layer 870 side.

Further, various methods can be used as a method for forming the EL layer 860 if an organic compound and an inorganic compound are mixed therein. For example, the methods include a co-evaporation method for vaporizing both an organic compound and an inorganic compound by resistance heating. Further, for co-evaporation, an inorganic compound may be vaporized by an electron beam (EB) while an organic compound is vaporized by resistance heating. Furthermore, a method for sputtering an inorganic compound while vaporizing an organic compound by resistance heating to deposit the both at the same time may be used. Instead, the EL layer 860 may be formed by a wet method.

As a method for manufacturing the first electrode layer 870 and the second electrode layer 850, an evaporation method by resistance heating, an EB evaporation method, a sputtering method, a CVD method, a spin coating method, a printing method, a dispenser method, a droplet discharging method, or the like can be used.

This embodiment mode can be combined with Embodiment Modes 1 and 2, as appropriate.

In this manner, with the use of the present invention, a display device having a light-emitting element, which has high image quality and high reliability, can be provided.

Embodiment Mode 4

This embodiment mode will describe other examples of a display device having a light-emitting element for achieving high image quality and high reliability. In this embodiment mode, other structures that can be applied to the light-emitting element in the display device of the present invention will be described with reference to FIGS. 11A to 11C and 12A to 12C.

Light-emitting elements using electroluminescence can be roughly classified into light-emitting elements that use an organic compound as a light-emitting material and light-emitting elements that use an inorganic compound as a light-emitting material. In general, the former is referred to as an organic EL element, while the latter is referred to as an inorganic EL element.

Inorganic EL elements are classified into a dispersion-type inorganic EL element and a thin-film-type inorganic EL element according to their element structures. The difference between the two EL elements lies in that the former dispersion-type inorganic EL element includes an electroluminescent layer in which particles of a light-emitting material are dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As types of light-emission mechanisms, there are luminescence obtained by donor-acceptor recombination which utilizes a donor level and an acceptor level, and local luminescence which utilizes inner-shell electron transition of metal ions. In general, a dispersion-type inorganic EL element exhibits luminescence through donor-acceptor recombination, while a thin-film-type inorganic EL element exhibits local luminescence in many cases.

A light-emitting material that can be used in the present invention contains a base material and an impurity element which serves as a luminescence center. By changing the impurity element to be contained in the light-emitting material, light emission of various colors can be obtained. As a method for forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid-phase method includes the steps of weighing a base material and an impurity element or a compound containing an impurity element, mixing them in a mortar, and heating and baking them in an electric furnace, so that reaction occurs and the impurity element is contained in the base material. The baking temperature is preferably 700° C. to 1500° C. This is because the solid-phase reaction will not proceed at too low temperature, whereas the base material will be decomposed at too high temperature. The baking may be performed in a powder state; however, it is preferably performed in a pellet state. Although the solid-phase method requires baking at relatively high temperature, the solid-phase method is easy to perform and has high productivity. Thus, it is suitable for mass production.

A liquid-phase method (a coprecipitation method) includes the steps of reacting a base material or a compound containing a base material with an impurity element or a compound containing an impurity element in a solution, drying them, and baking them. Particles of a light-emitting material are uniformly diffused, whereby reaction can proceed even when the particle size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), or barium gallium sulfide ($BaGa_2S_4$), or the like.

For a luminescence center of an EL element which exhibits local luminescence, the following can be used: manganese (Mn), copper (Cu), samarium (Sm), terbium (Tb), erbium (Er), thulium (Tm), europium (Eu), cerium (Ce), praseodymium (Pr), and the like. Note that a halogen element such as fluorine (F) or chlorine (Cl) may also be added. The halogen element can function to compensate electric charge.

Meanwhile, for a luminescence center of an EL element which exhibits luminescence through donor-acceptor recombination, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits luminescence through donor-acceptor recombination by using a solid-phase method, the following steps are performed: weighing a base material, weighing a first impurity element or a compound containing the first impurity element weighing a second impurity element or a compound containing the second impurity element, mixing them in a mortar, and heating and baking them in an electric furnace. As a base material, the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700° C. to 1500° C. This is because the solid-phase reaction will not proceed at too low temperature, whereas the base material will be decomposed at too high temperature. The baking may be performed in a powder state; however, it is preferably performed in a pellet state.

In the case of performing solid-phase reaction, it is also possible to use a compound containing the first impurity element and the second impurity element as the impurity element. In that case, the impurity elements can be easily diffused, and solid-phase reaction can easily proceed; therefore, a uniform light-emitting material can be obtained. Further, since unnecessary impurity elements are not mixed, a light-emitting material with high purity can be obtained. Examples of the compound containing the first impurity element and the second impurity element include copper chloride (CuCl) and silver chloride (AgCl).

Note that the concentration of the impurity element with respect to the base material may be 0.01 at. % to 10 at. %, preferably, 0.05 at. % to 5 at. %.

With regard to a thin-film-type inorganic EL element, an electroluminescent layer contains the above-described light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low pressure hydride transport CVD method, an atomic layer epitaxy (ALE) method, or the like.

Figure 11A:
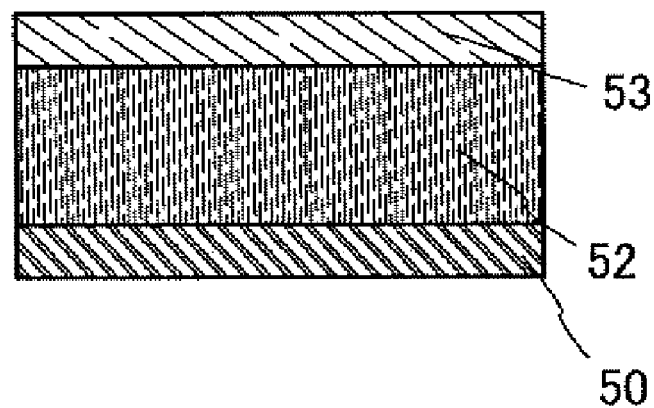
FIGS. 11A to 11C are diagrams illustrating a structure of a light-emitting element applicable to the present invention.
Figure 11B:
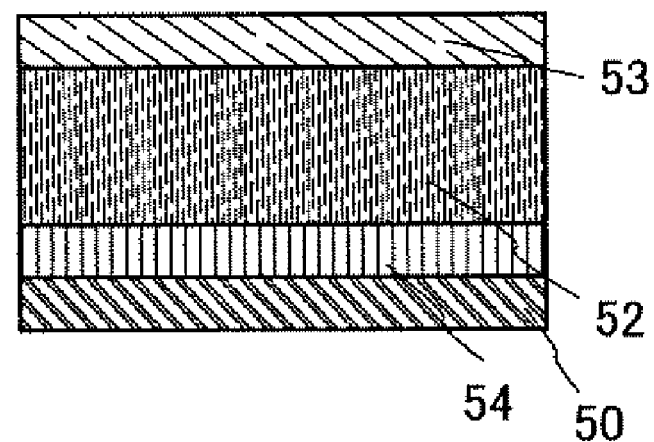
Figure 11C:
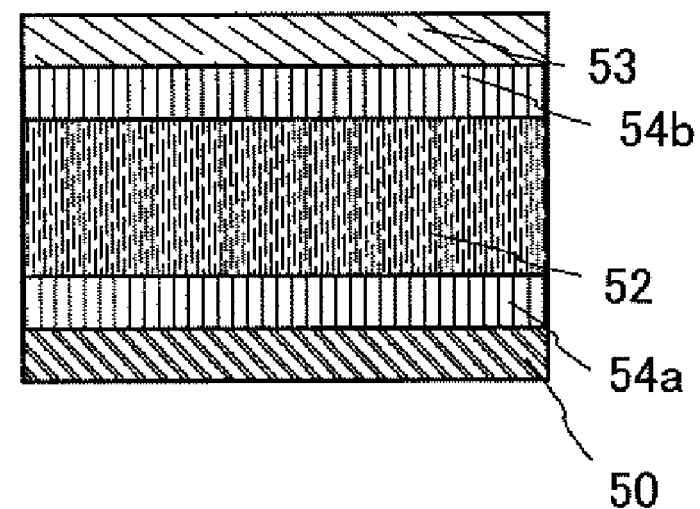

FIGS. 11A to 11C show examples of a thin-film-type inorganic EL element that can be used as a light-emitting element. Each of the light-emitting elements shown in FIGS. 11A to 11C includes a first electrode layer 50, an electroluminescent layer 52, and a second electrode layer 53.

The light-emitting elements shown in FIGS. 11B and 11C each have a structure in which an insulating layer is provided between the electrode layer and the electroluminescent layer of the light-emitting element shown in FIG. 11A. The light-emitting element shown in FIG. 11B has an insulating layer 54 between the first electrode layer 50 and the electroluminescent layer 52. The light-emitting element shown in FIG. 11C has an insulating layer 54a between the first electrode layer 50 and the electroluminescent layer 52, and an insulating layer 54b between the second electrode layer 53 and the electroluminescent layer 52. As described above, the insulating layer may be provided between one or each of the pair of electrode layers and the electroluminescent layer. In addition, the insulating layer can be either a single layer or a plurality of stacked layers.

Although the insulating layer 54 in FIG. 11B is provided to be in contact with the first electrode layer 50, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing particulate light-emitting materials in a binder. The light-emitting material is processed into particulate forms. When particles with a desired size cannot be obtained due to a method for forming a light-emitting material, the material may be processed into particulate forms by being ground in a mortar or the like. A binder is a substance for fixing particulate light-emitting materials to be in a dispersed state in order to keep the shape of the electroluminescent layer. Light-emitting materials are uniformly dispersed and fixed in the electroluminescent layer by the binder.

The electroluminescent layer of the dispersion-type inorganic EL element can be formed by a droplet discharging method by which an electroluminescent layer can be selectively formed, a printing method (e.g., screen printing or offset printing), a coating method such as a spin coating method, a dipping method, a dispenser method, or the like. The thickness of the electroluminescent layer is not limited to a specific value; however, it is preferably in the range of 10 nm to 1000 nm. In the electroluminescent layer which contains a light-emitting material and a binder, the percentage of the light-emitting material is preferably greater than or equal to 50 wt % and less than or equal to 80 wt %.

Figure 12A:
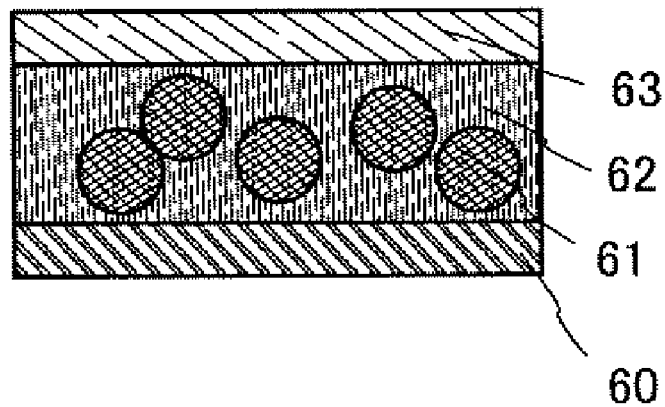
FIGS. 12A to 12C are diagrams illustrating a structure of a light-emitting element applicable to the present invention.
Figure 12B:
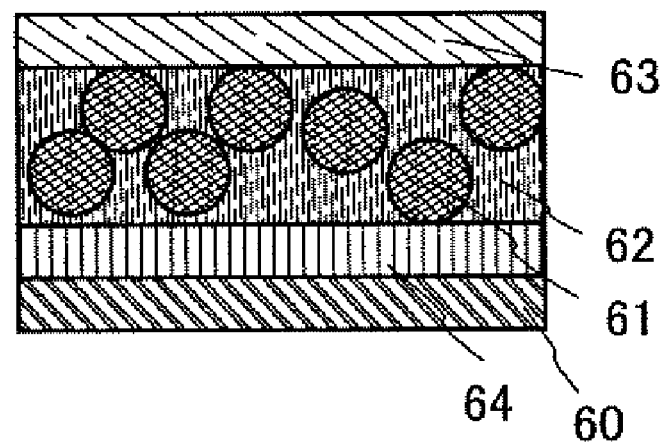
Figure 12C:
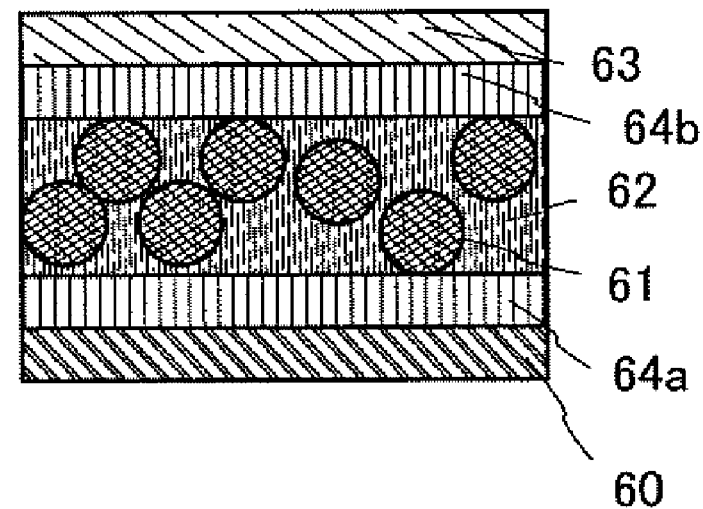

FIGS. 12A to 12C show examples of a dispersion-type inorganic EL element that can be used as a light-emitting element. The light-emitting element shown in FIG. 12A has a structure in which a first electrode layer 60, an electroluminescent layer 62, and a second electrode layer 63 are stacked, and the electroluminescent layer 62 contains a light-emitting material 61 fixed by a binder.

As a binder that can be used in this embodiment mode, an organic material, an inorganic material, or a mixed material of an organic material and an inorganic material can be used. As an organic material, the following resins can be used: a polymer having a relatively high dielectric constant such as a cyanoethyl cellulose based resin, a polyethylene resin, a polypropylene resin, a polystyrene based resin, a silicone resin, an epoxy resin, and vinylidene fluoride. Further, it is also possible to use thermally stable high molecular materials such as aromatic polyamide and polybenzimidazole, or a siloxane resin. Note that a siloxane resin has the bond of Si—O—Si. Siloxane has a skeleton structure with the bond of silicon (Si) and oxygen (O). As a substituent, an organic group containing at least hydrogen (e.g., an alkyl group or aromatic hydrocarbon) is used. Further, a fluoro group may be used as the substituent, or both a fluoro group and an organic group containing at least hydrogen may be used as the substituent. Further, it is also possible to use a resin material such as a vinyl resin (e.g., polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles of, for example, barium titanate ($BaTiO_3$) or strontium titanate ($SrTiO_3$) are mixed as appropriate into the above-described resin, the dielectric constant of the material can be controlled.

As an inorganic material contained in the binder, the following materials can be used: silicon oxide (SiO), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic material. When a high-dielectric-constant inorganic material is mixed into an organic material (by doping or the like), it becomes possible to control the dielectric constant of the electroluminescent layer which contains a light-emitting material and a binder more efficiently, whereby the dielectric constant can be further increased.

In the manufacturing process, light-emitting materials are dispersed in a solution containing a binder. As a solvent of the solution containing a binder that can be used in this embodiment mode, it is preferable to select a solvent as appropriate in which a binder material can be dissolved and with which a solution having a viscosity suitable for a method for forming the electroluminescent layer (various wet processes) and a desired film thickness can be formed. An organic solvent or the like can be used. For example, when a siloxane resin is used as a binder, organic solvents of for example, propylene glycolmonomethyl ether; propylene glycolmonomethyl ether acetate (also referred to as PGMEA), or 3-methoxy-3-methyl-1-butanol (also referred to as MMB) can be used.

The light-emitting elements shown in FIGS. 12B and 12C each have a structure in which an insulating layer is provided between the electrode layer and the electroluminescent layer of the light-emitting element shown in FIG. 12A. The light-emitting element shown in FIG. 12B has an insulating layer 64 between the first electrode layer 60 and the electroluminescent layer 62. The light-emitting element shown in FIG. 12C has an insulating layer 64a between the first electrode layer 60 and the electroluminescent layer 62, and an insulating layer 64b between the second electrode layer 63 and the electroluminescent layer 62. As described above, the insulating layer may be provided between one or each of the pair of electrode layers and the electroluminescent layer. In addition, the insulating layer can be either a single layer or a plurality of stacked layers.

In addition, although the insulating layer 64 is provided to be in contact with the first electrode layer 60 in FIG. 12B, the insulating layer 64 may also be provided to be in contact with the second electrode layer 63 by reversing the order of the insulating layer and the electroluminescent layer.

Although the insulating layers 54, 54a, 54b, 64, 64a, and 64b shown in FIGS. 11B, 11C, 12B and 12C are not particularly limited to certain types, such insulating layers preferably have a high withstand voltage and dense film quality. Further, such insulating layers preferably have a high dielectric constant. For example, the following materials can be used: silicon oxide ($SiO_2$), yttrium oxide ($Y_2O_3$), titanium oxide ($TiO_2$), aluminum oxide ($Al_2O_3)_3$, hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), and the like. Further, a mixed film of such materials or a stacked film containing two or more of such materials can also be used. Such insulating films can be formed by sputtering, evaporation, CVD, or the like. Further, it is also possible to form an insulating layer by dispersing particulate insulating materials in a binder. The binder material may be formed using a material and method similar to those of the binder contained in the electroluminescent layer. Although the thickness of such an insulating layer is not particularly limited, it is preferably in the range of 10 nm to 1000 nm.

The light-emitting element shown in this embodiment mode emits light when a voltage is applied between the pair of electrode layers which sandwich the electroluminescent layer, and can be operated by either DC driving or AC driving.

This embodiment mode can be combined with Embodiment Modes 1 and 2 as appropriate.

With the use of the present invention, a display device which has high image quality and high reliability can be provided.

Embodiment Mode 5

A television device can be completed using a display device formed by the present invention. An example of a television device for achieving high image quality and high reliability will be described.

Figure 18:
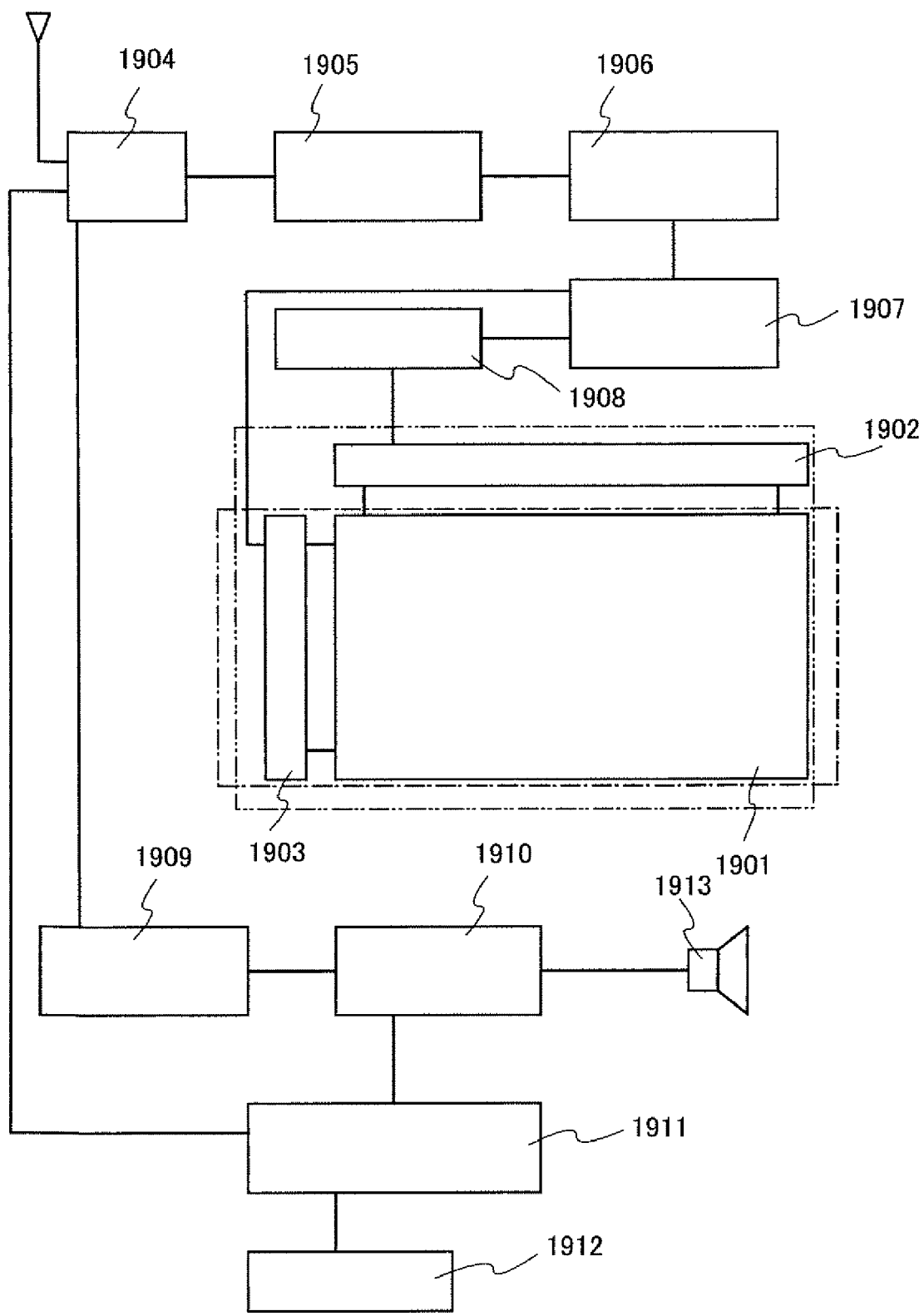
FIG. 18 is a block diagram illustrating a main structure of an electronic device to which the present invention is applied.

FIG. 18 is a block diagram showing a main configuration of a television device (an EL television device). A display panel can have various structures: a structure in which TFTs are formed, a pixel region 1901 and a scan line driver circuit 1903 are formed over the same substrate and a signal line driver circuit 1902 is formed as a driver IC; a structure in which the pixel region 1901, the signal line driver circuit 1902, and the scan line driver circuit 1903 are formed over the same substrate; and the like.

As for the structures of other external circuits, a video signal amplifier circuit 1905 for amplifying video signals among signals received at a tuner 1904; a video signal processing circuit 1906 for converting signals output from the video signal amplifier circuit 1905 into color signals corresponding to red, green, and blue; a control circuit 1907 for converting the video signals so as to be input into the driver ICs; and the like are provided on the input side of the video signals. The control circuit 1907 outputs signals to each of the scanning line side and the signal line side. In the case of digitally driving the display panel, a signal divider circuit 1908 may be provided on the signal line side so that input digital signals can be divided into m number of signals before supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control data on the receiving station (reception frequency) or sound volume from an input portion 1912 and transmits signals to the tuner 1904 and the audio signal processing circuit 1910.

Figure 15A:
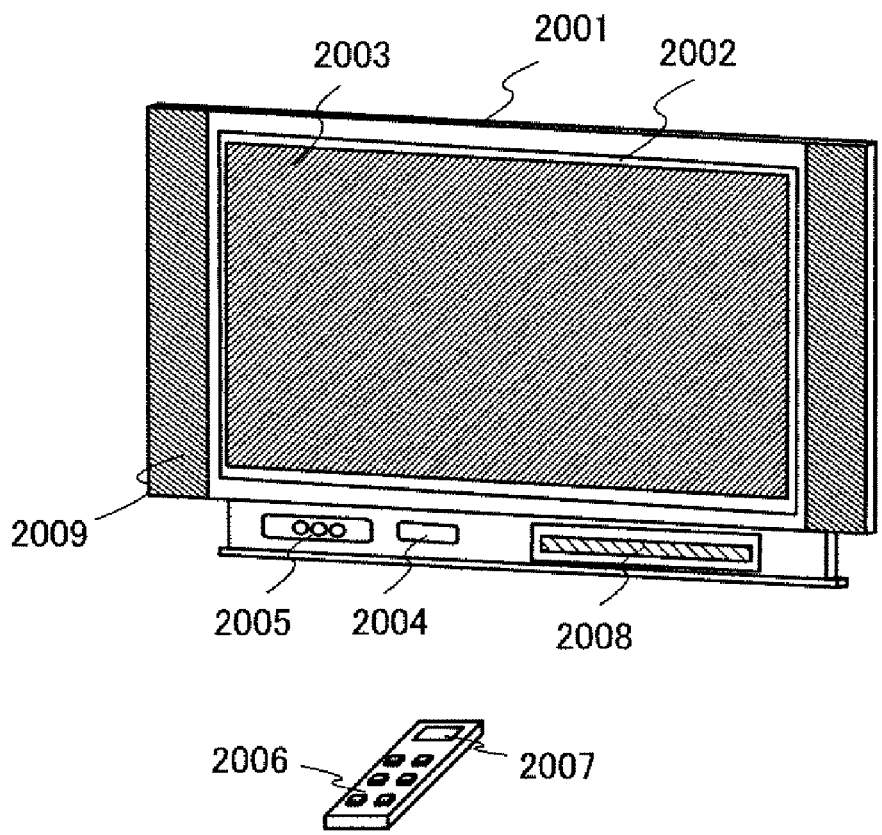
FIGS. 15A and 15B are diagrams illustrating electronic devices to which the present invention is applied.
Figure 15B:
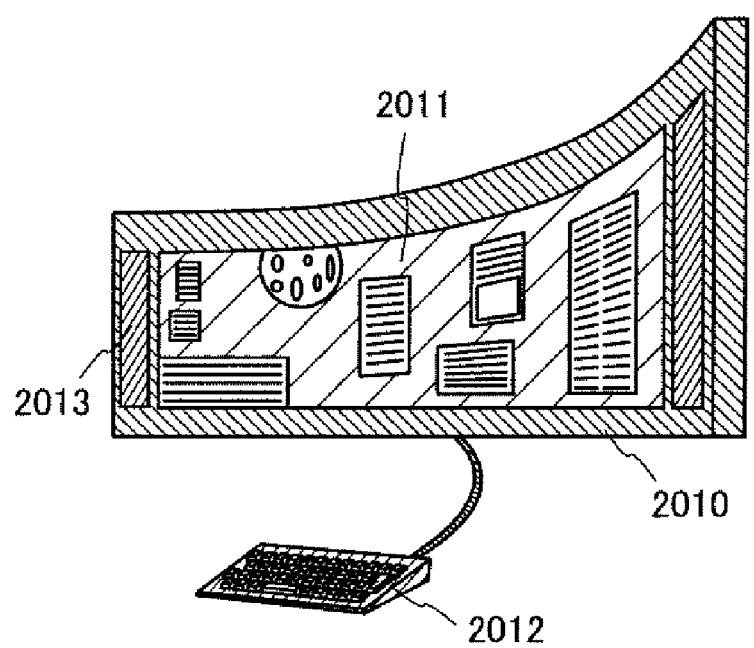

By incorporating a display module into a housing as shown in FIGS. 15A and 15B, a television device can be completed. A display panel in which components up to an FPC are set as shown in FIGS. 1A and 1B is generally called an EL display module. When an EL display module as shown in FIGS. 1A and 1B is used, an EL television device can be completed. A display module constitutes a main display screen 2003, and other accessories such as speaker portions 2009 and operation switches are provided. As described above, a television device can be completed according to the present invention.

In addition, reflected light of light entering from outside may be blocked with the use of a retardation plate or a polarizing plate. In a top-emission display device, an insulating layer serving as a partition wall may be colored to be used as a black matrix. This partition wall can also be formed by a droplet discharging method or the like. Carbon black or the like may be mixed into a black resin of a pigment material or a resin material such as polyimide, or a stacked layer thereof may be used. By a droplet discharging method, different materials may be discharged to the same region plural times to form the partition wall. A quarter wave plate or a half wave plate may be used as the retardation plate and may be designed to be able to control light. As the structure, the light-emitting element, the sealing substrate (sealant), the retardation plates (a quarter wave plate ($\lambda/4$) and a half wave plate ($\lambda/2$)), and the polarizing plate are formed over a TFT element substrate in order, and light emitted from the light-emitting element is transmitted therethrough and is emitted to outside from the polarizing plate side. The retardation plate or polarizing plate may be provided on a side to which light is emitted or may be provided on both sides in the case of a dual-emission display device in which light is emitted from the both sides. In addition, an anti-reflective film may be provided on the outer side of the polarizing plate. Accordingly, high-definition and precise images can be displayed.

A display panel 2002 using a display element is incorporated into a housing 2001, as shown in FIG. 15A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated with switches incorporated in the housing or with a remote control device 2006 separated from the main body. A display portion 2007 that displays information to be output may also be provided for this remote control device.

In addition, for the television device, a structure for displaying a channel, sound volume, or the like may be additionally provided by formation of a sub-screen 2008 with a second display panel in addition to the main screen 2003. In this structure, the main screen 2003 may be formed using an EL display panel superior in viewing angle, and the sub-screen may be formed using a liquid crystal display panel capable of displaying with low power consumption. In order to prioritize low power consumption, a structure in which the main screen 2003 is formed using a liquid crystal display panel, the sub-screen is formed using an EL display panel, and the sub-screen is able to flash on and off may be employed. By the present invention, such a highly reliable display device with high image quality can be manufactured even with the use of a large substrate, and many TFTs and electronic components.

FIG. 15B shows a television device which has a large display portion, for example, 20-inch to 80-inch display portion and includes a housing 2010, a keyboard portion 2012 which is an operation portion, a display portion 2011, a speaker portion 2013, and the like. The present invention is applied to manufacture of the display portion 2011. The display portion in FIG. 15B is formed using a bendable material; therefore, the television device includes the bent display portion. Since the shape of the display portion can be freely set, a television device having a desired shape can be manufactured.

In accordance with the present invention, a highly reliable display device which has a function of displaying high quality images with excellent visibility can be manufactured without a complicated process. Therefore, a high performance and highly reliable television device can be manufactured with high productivity.

The present invention is not limited to the television device and is also applicable to various uses such as a monitor of a personal computer and a display medium with a large area, for example, an information display board at a train station, an airport, or the like, or an advertisement display board on the street.

Embodiment Mode 6

This embodiment mode will be described with reference to FIGS. 16A and 16B. This embodiment mode shows an example of a module using a panel including the display device manufactured in Embodiment Modes 1 to 5. In this embodiment mode, an example of a module including a display device for achieving high image quality and high reliability will be described.

Figure 16A:
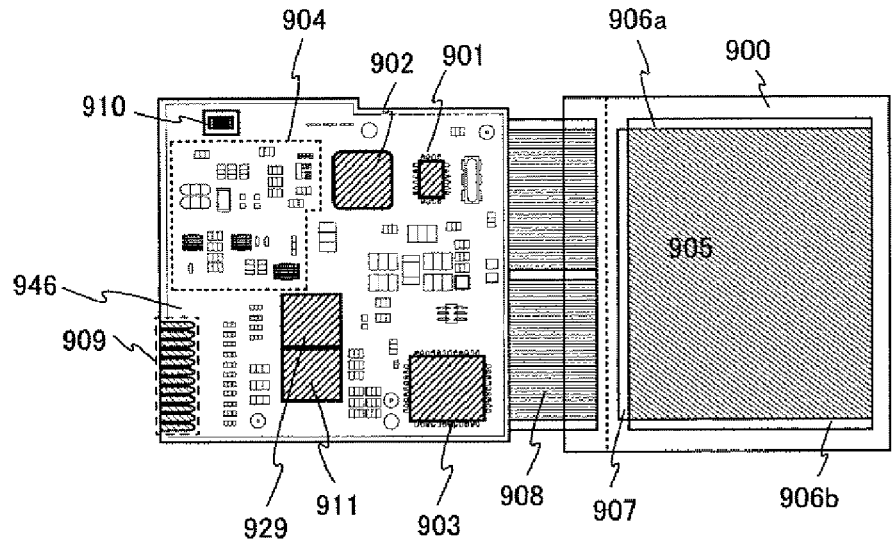
FIGS. 16A and 16B are diagrams illustrating electronic devices to which the present invention is applied.

A module of an information terminal shown in FIG. 16A includes a printed wiring board 946 on which a controller 901, a central processing unit (CPU) 902, a memory 911, a power source circuit 903, an audio processing circuit 929, a transmission/reception circuit 904, and other elements such as a resistor, a buffer, and a capacitor are mounted. In addition, a panel 900 is connected to the printed wiring board 946 through a flexible printed circuit (FPC) 908.

The panel 900 is provided with a pixel region 905 having a light-emitting element in each pixel, a first scan line driver circuit 906a and a second scan line driver circuit 906b which select a pixel included in the pixel region 905, and a signal line driver circuit 907 which supplies a video signal to the selected pixel.

Various control signals are input and output through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power source circuit 903 may be directly mounted on the panel 900 by a COG (chip on glass) method. Moreover, various elements such as a capacitor and a buffer provided over the printed wiring board 946 prevent a noise in a power source voltage or a signal and a rounded rise of a signal.

Figure 16B:
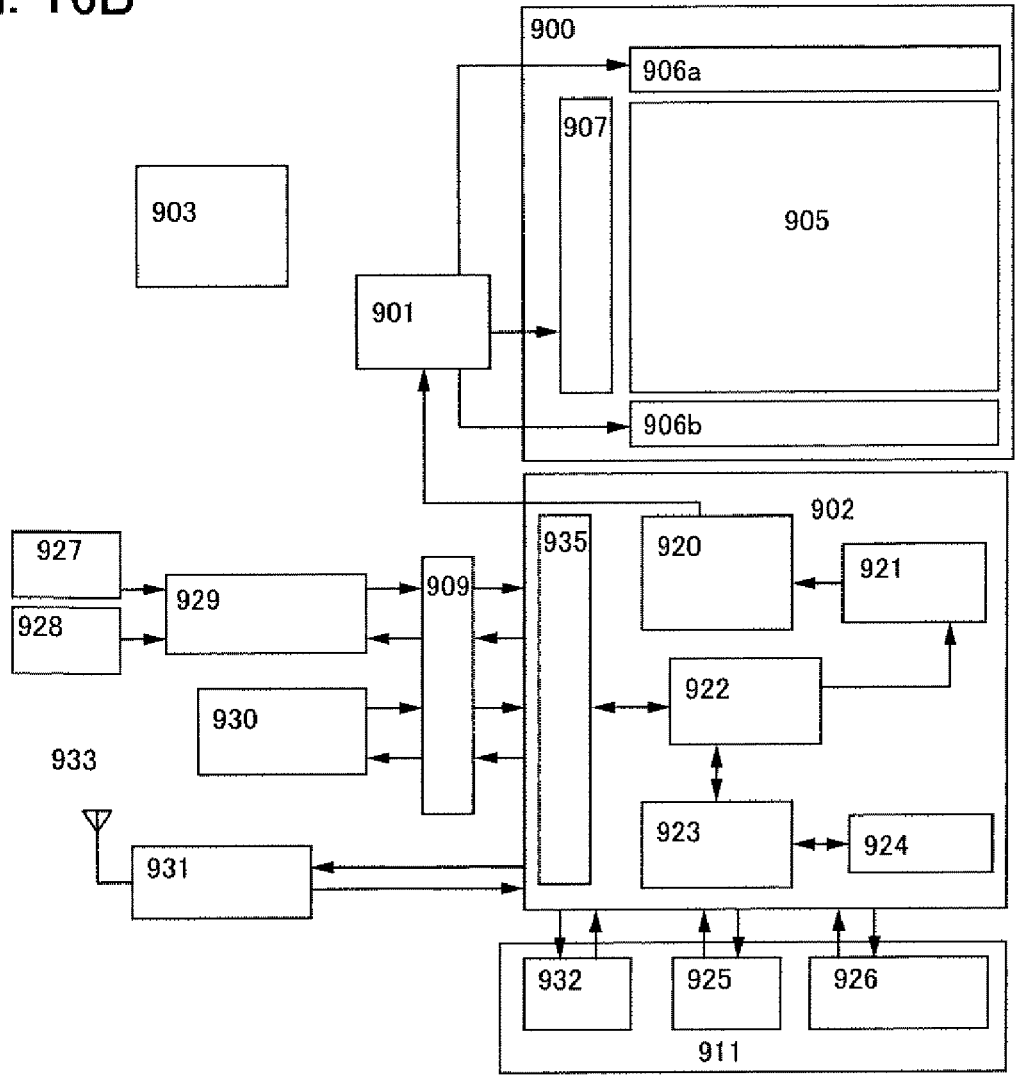

FIG. 16B is a block diagram of the module shown in FIG. 16A. A module 999 includes a VRAM 932, a DRAM 925, a flash memory 926, and the like as the memory 911. The VRAM 932 stores image data to be displayed on the panel, the DRAM 925 stores image data or audio data, and the flash memory stores various programs.

The power source circuit 903 generates a power source voltage applied to the panel 900, the controller 901, the CPU 902, the audio processing circuit 929, the memory 911, and a transmission/reception circuit 931. Moreover, depending on the specifications of the panel, a current source is provided in the power source circuit 903 in some cases.

The CPU 902 includes a control signal generating circuit 920, a decoder 921, a register 922, an arithmetic circuit 923, a RAM 924, an interface 935 for the CPU, and the like. Various signals input into the CPU 902 through the interface 935 are input into the arithmetic circuit 923, the decoder 921, and the like after once being held in the register 922. The arithmetic circuit 923 operates based on the input signal and specifies an address to which various instructions are sent. On the other hand, the signal input into the decoder 921 is decoded and input into the control signal generating circuit 920. The control signal generating circuit 920 generates a signal including various instructions based on the input signal and sends it to the address specified by the arithmetic circuit 923, specifically, the memory 911, the transmission/reception circuit 931, the audio processing circuit 929, the controller 901, and the like.

The memory 911, the transmission/reception circuit 931, the audio processing circuit 929, and the controller 901 operate in accordance with respective received instructions. The operations will be briefly described below.

The signal input from an input unit 930 is transmitted to the CPU 902 mounted on the printed wiring board 946 through the interface 909. The control signal generating circuit 920 converts the image data stored in the VRAM 932 into a given format in accordance with the signal transmitted from the input unit 930 such as a pointing device and a keyboard, and then transmits it to the controller 901.

The controller 901 processes a signal including image data transmitted from the CPU 902 in accordance with the specifications of the panel and supplies it to the panel 900. The controller 901 generates a Hsync signal, a Vsync signal, a clock signal CLK, an alternating voltage (AC Cont), and a switching signal L/R and supplies them to the panel 900 based on the power source voltage input from the power source circuit 903 and various signals input from the CPU 902.

In the transmission/reception circuit 904, a signal transmitted and received as an electric wave at an antenna 933 is processed. Specifically, high frequency circuits such as an isolator, a band path filter, a VCO (voltage controlled oscillator), an LPF (low pass filter), a coupler, and a balun are included. Among the signals transmitted and received at the transmission/reception circuit 904, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode is applicable to any circuit other than high frequency circuits such as an isolator, a band path filter, a VCO (voltage controlled oscillator), an LPF (low pass filter), a coupler, and a balun.

Embodiment Mode 7

Figure 17:
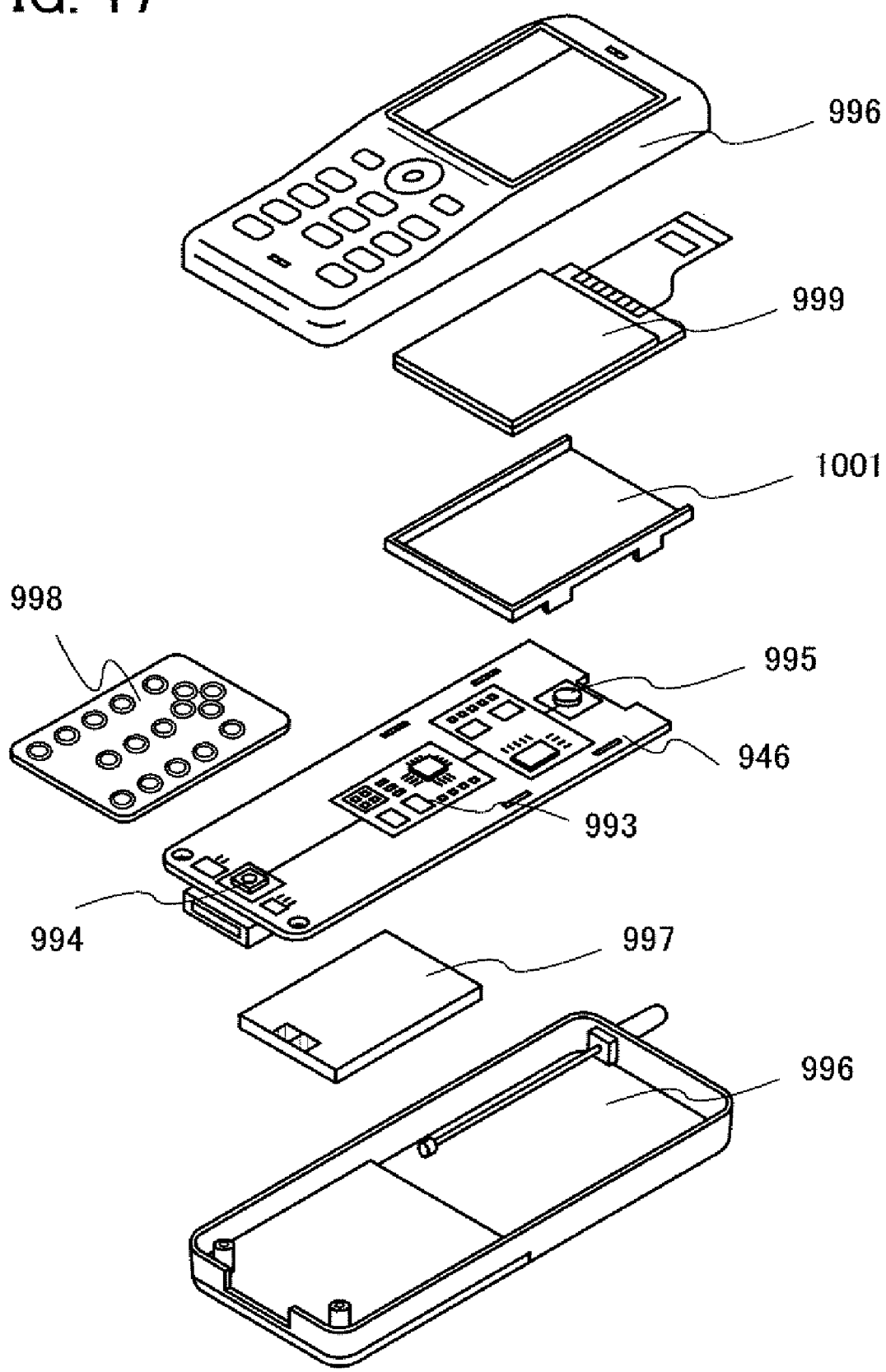
FIG. 17 is a diagram illustrating an electronic device to which the present invention is applied.

This embodiment mode will be described with reference to FIGS. 16A and 16B and 17. FIG. 17 shows one mode of a compact phone (cellular phone) including the module manufactured in Embodiment Mode 6, which operates wirelessly and is portable. The panel 900 is detachably incorporated into a housing 1001 so as to be easily combined with the module 999. The shape and the size of the housing 1001 can be changed, as appropriate, in accordance with an electronic device into which the module is incorporated.

The housing 1001 in which the panel 900 is fixed is fitted to the printed wiring board 946 and set up as a module. A controller, a CPU, a memory, a power source circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed wiring board 946 through the FPC 908.

The module 999, an input unit 998, and a battery 997 are stored in a housing 996. The pixel region of the panel 900 is arranged so that it can be seen through a window formed in the housing 996.

The housing 996 shown in FIG. 17 is an example of an exterior shape of a telephone. However, an electronic device of this embodiment mode can be changed into various modes in accordance with functions and intended purpose. In the following embodiment mode, examples of the modes will be explained.

Embodiment Mode 8

By applying the present invention, various display devices can be manufactured. In other words, the present invention is applicable to various electronic devices in which these display devices are incorporated into display portions. In his embodiment mode, examples of electronic devices including a display device for achieving high image quality and high reliability will be described.

As electronic devices of the present invention, television devices (also referred to simply as televisions or television receivers), cameras such as digital cameras or digital video cameras, cellular phone sets (also referred to simply as cellular phones or cell-phones), portable information terminals such as PDAs, portable game machines, monitors for computers, computers, audio reproducing devices such as car audio systems, image reproducing devices provided with a recording medium such as home game machines (typically, a digital versatile disc (DVD)), and the like can be given. Specific examples thereof will be explained with reference to FIGS. 14A to 14E.

Figure 14A:
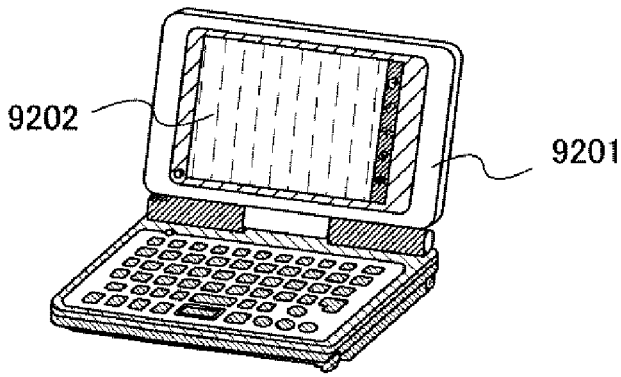
FIGS. 14A to 14E are diagrams illustrating electronic devices to which the present invention is applied.

A portable information terminal shown in FIG. 14A includes a main body 9201, a display portion 9202, and the like. The display device of the present invention is applicable to the display portion 9202. Accordingly, a highly reliable portable information terminal with high image quality can be provided.

Figure 14B:
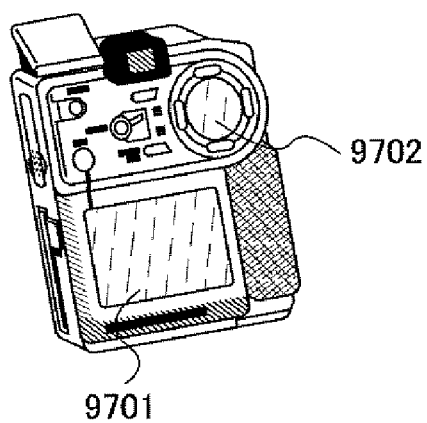

A digital video camera shown in FIG. 14B includes display portions 9701 and 9702, and the like. The display device of the present invention is applicable to the display portion 9701. Accordingly, a highly reliable digital video camera with high image quality can be provided.

Figure 14C:
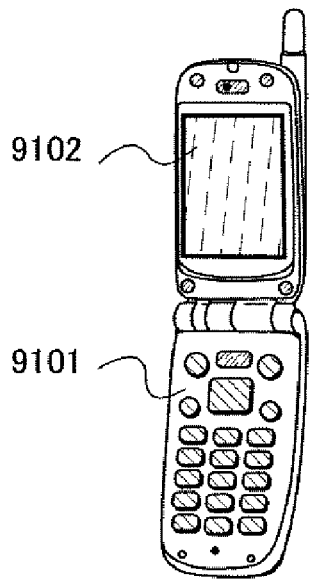

A cellular phone shown in FIG. 14C includes a main body 9101, a display portion 9102, and the like. The display device of the present invention is applicable to the display portion 9102. Accordingly, a highly reliable cellular phone with high image quality can be provided.

Figure 14D:
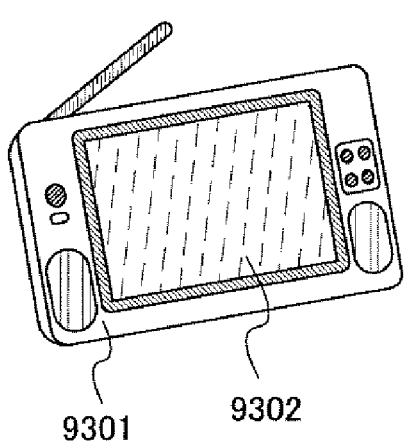

A portable television device shown in FIG. 14D includes a main body 9301, a display portion 9302, and the like. The display device of the present invention is applicable to the display portion 9302. Accordingly, a highly reliable portable television device with high image quality can be provided. The display device of the present invention is applicable to various types of television devices including a small-sized television incorporated in a portable terminal such as a cellular phone set, a medium-sized television that is portable, and a large-sized television (e.g., 40 inches or more in size).

Figure 14E:
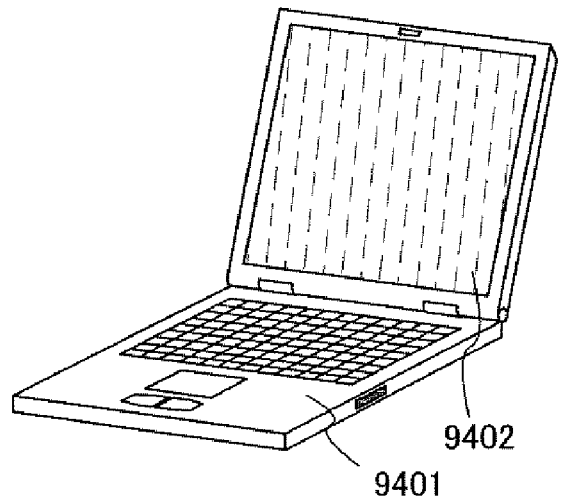

A portable computer shown in FIG. 14E includes a main body 9401, a display portion 9402, and the like. The display device of the present invention is applicable to the display portion 9402. Accordingly, a highly reliable portable computer with high image quality can be provided.

The display device of the present invention can be used as a lighting system. The display device to which the present invention is applied can also be used as a small table lamp or a large-scale lighting system in a room. Further, the display device of the present invention can also be used as the backlight of a liquid crystal display device. The display device of the present invention is used as the backlight of the liquid crystal display device, whereby the liquid crystal display device can achieve high image quality and high performance without display unevenness. The display device of the present invention is a plane-emission lighting system and can have a large area; therefore, backlight can have a large area and the liquid crystal display device can also have a large area. Further, since the display device of the present invention is thin, the liquid crystal display device can be made to be tin.

In this manner, by using the display device of the present invention, highly reliable electronic devices which have high image quality can be provided.

This application is based on Japanese Patent Application serial No. 2007-132181 filed with Japan Patent Office on May 17, 2007, the entire contents of which are hereby incorporated by reference.

What is claimed is:

1. A display device comprising:
a pixel region and a reference circuit each provided over a light-transmitting substrate having an insulating surface;
a transistor in the pixel region; and
a bipolar transistor in the reference circuit,
wherein the transistor and the bipolar transistor are formed of a continuous single-crystal semiconductor layer,
wherein the transistor and the bipolar transistor are electrically isolated from each other by an element isolation region,
wherein the transistor is electrically connected to a light-emitting element comprising a first electrode layer, an electroluminescent layer and a second electrode layer,
wherein the single-crystal semiconductor layer and the element isolation region have an opening in a region overlapped with the first electrode layer,
wherein the opening is filled with an insulating layer,
wherein the first electrode layer is formed over the insulating layer,
wherein the electroluminescent layer is formed over the first electrode layer, and
wherein the second electrode layer is formed over the electroluminescent layer.

2. The display device according to claim 1, wherein the single-crystal semiconductor layer is bonded to the light-transmitting substrate having the insulating surface by using a silicon oxide film.

3. The display device according to claim 1, wherein a thickness of the single-crystal semiconductor layer is more than or equal to 1 μm and less than or equal to 3 μm.

4. The display device according to claim 1, wherein a driver circuit region is provided over the light-transmitting substrate having the insulating surface.

5. The display device according to claim 1, wherein the light-emitting element comprises an organic light-emitting material.

6. A display device comprising:
a pixel region and a reference circuit each provided over a light-transmitting substrate having an insulating surface;
a transistor in the pixel region; and
a bipolar transistor in the reference circuit,
wherein the transistor and the bipolar transistor are formed of a continuous single-crystal semiconductor layer,
wherein the transistor and the bipolar transistor are electrically isolated from each other by an element isolation region,
wherein the transistor is electrically connected to a light-emitting element comprising a first electrode layer, an electroluminescent layer and a second electrode layer,
wherein the single-crystal semiconductor layer is provided with an opening in a region overlapped with the first electrode layer,
wherein the opening is filled with an insulating layer,
wherein the first electrode layer is formed over the insulating layer,
wherein the electroluminescent layer is formed over the first electrode layer, and
wherein the second electrode layer is formed over the electroluminescent layer.

7. The display device according to claim 6, wherein the single-crystal semiconductor layer is bonded to the light-transmitting substrate having the insulating surface by using a silicon oxide film.

8. The display device according to claim 6, wherein a thickness of the single-crystal semiconductor layer is more than or equal to 1 μm and less than or equal to 3 μm.

9. The display device according to claim 6, wherein a driver circuit region is provided over the light-transmitting substrate having the insulating surface.

10. The display device according to claim 6, wherein the light-emitting element comprises an organic light-emitting material.

* * * * *